(12) United States Patent
Lee et al.

(10) Patent No.: US 9,391,186 B2
(45) Date of Patent: Jul. 12, 2016

(54) SEMICONDUCTOR DEVICE

(71) Applicant: Samsung Electronics Co., Ltd., Suwon-si (KR)

(72) Inventors: Jae Hoon Lee, Suwon-si (KR); Chan Ho Park, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/458,288

(22) Filed: Aug. 13, 2014

(65) Prior Publication Data

US 2015/0162427 A1    Jun. 11, 2015

(30) Foreign Application Priority Data

Dec. 9, 2013  (KR) .................. 10-2013-0152569

(51) Int. Cl.

| H01L 29/778 | (2006.01) |
|---|---|
| H01L 29/04 | (2006.01) |
| H01L 29/267 | (2006.01) |
| H01L 29/66 | (2006.01) |
| H01L 29/10 | (2006.01) |
| H01L 29/20 | (2006.01) |

(52) U.S. Cl.
CPC ........ *H01L 29/7787* (2013.01); *H01L 29/1029* (2013.01); *H01L 29/66462* (2013.01); *H01L 29/2003* (2013.01)

(58) Field of Classification Search
CPC ... H01L 21/335; H01L 29/772; H01L 29/778; H01L 29/7373; H01L 29/66462; H01L 29/7783; H01L 29/66318; H01L 29/66431; H01L 2924/13064; H01L 29/045; H01L 29/267; H01L 29/7787; H01L 29/04
See application file for complete search history.

(56) References Cited

U.S. PATENT DOCUMENTS

| 6,049,091 | A  * | 4/2000 | Yokoyama ...................... 257/52 |
|---|---|---|---|
| 7,057,216 | B2 | 6/2006 | Ouyang et al. |
| 7,084,441 | B2 * | 8/2006 | Saxler ........................... 257/243 |
| 7,348,243 | B2 * | 3/2008 | Kim .................. H01L 21/26586 257/E21.133 |
| 7,927,989 | B2 * | 4/2011 | Zhang ............... H01L 21/26506 257/E21.431 |
| 8,198,178 | B2 | 6/2012 | Heikman et al. |
| 8,309,987 | B2 | 11/2012 | Derluyn et al. |
| 8,318,562 | B2 | 11/2012 | Khan et al. |
| 8,816,391 | B2 * | 8/2014 | Ko et al. ......................... 257/192 |
| 2003/0098462 | A1 * | 5/2003 | Yoshida ......................... 257/183 |
| 2003/0107051 | A1 | 6/2003 | Park et al. |
| 2003/0218183 | A1 * | 11/2003 | Micovic et al. ............... 257/192 |

(Continued)

FOREIGN PATENT DOCUMENTS

| JP | 2002-009253 | 1/2002 |
|---|---|---|
| JP | 4631104 | 2/2011 |

(Continued)

*Primary Examiner* — Davienne Monbleau
*Assistant Examiner* — Fazli Erdem
(74) *Attorney, Agent, or Firm* — Muir Patent Law, PLLC

(57) ABSTRACT

A semiconductor device may include: a first semiconductor layer having a first band gap; a second semiconductor layer including first and second regions separately disposed on an upper surface of the first semiconductor layer and having a second band gap wider than the first band gap; and a third semiconductor layer disposed between the first and second regions of the second semiconductor layer, extending up to at least a portion of the first semiconductor layer. The third semiconductor layer may have a channel region doped with an impurity.

15 Claims, 18 Drawing Sheets

(56) References Cited

U.S. PATENT DOCUMENTS

| | | | |
|---|---|---|---|
| 2004/0021152 A1 | 2/2004 | Nguyen et al. | |
| 2005/0023555 A1* | 2/2005 | Yoshida et al. | 257/192 |
| 2007/0176201 A1* | 8/2007 | Beach et al. | 257/192 |
| 2007/0278518 A1 | 12/2007 | Chen et al. | |
| 2008/0303064 A1* | 12/2008 | Sato | 257/194 |
| 2009/0258470 A1* | 10/2009 | Choi | C23C 16/308 438/386 |
| 2009/0267078 A1* | 10/2009 | Mishra et al. | 257/76 |
| 2010/0052043 A1* | 3/2010 | Lee | 257/325 |
| 2011/0057233 A1* | 3/2011 | Park et al. | 257/194 |
| 2011/0068370 A1* | 3/2011 | Kim et al. | 257/194 |
| 2011/0084284 A1* | 4/2011 | Zhang et al. | 257/77 |
| 2011/0210377 A1 | 9/2011 | Haeberlen et al. | |
| 2011/0233613 A1* | 9/2011 | Jeon et al. | 257/194 |
| 2011/0303952 A1* | 12/2011 | Hwang et al. | 257/194 |
| 2012/0112202 A1* | 5/2012 | Hwang et al. | 257/76 |
| 2012/0187452 A1 | 7/2012 | Saito et al. | |
| 2012/0280244 A1* | 11/2012 | Hwang et al. | 257/76 |
| 2013/0001646 A1 | 1/2013 | Corrion et al. | |
| 2013/0043468 A1* | 2/2013 | Adekore | 257/43 |
| 2013/0062616 A1 | 3/2013 | Takehiko et al. | |
| 2013/0099285 A1* | 4/2013 | Hwang et al. | 257/194 |
| 2013/0099286 A1 | 4/2013 | Imada et al. | |
| 2013/0271208 A1* | 10/2013 | Then et al. | 327/541 |
| 2014/0027779 A1* | 1/2014 | Hwang et al. | 257/76 |
| 2014/0077267 A1* | 3/2014 | Heo | 257/194 |
| 2014/0091366 A1* | 4/2014 | Jeon et al. | 257/195 |
| 2014/0131785 A1* | 5/2014 | Seo et al. | 257/316 |
| 2014/0252368 A1* | 9/2014 | Lee et al. | 257/76 |
| 2014/0253241 A1* | 9/2014 | Lee et al. | 330/277 |
| 2014/0264454 A1* | 9/2014 | Banerjee et al. | 257/194 |
| 2015/0008485 A1* | 1/2015 | Hwang et al. | 257/194 |

FOREIGN PATENT DOCUMENTS

| | | |
|---|---|---|
| JP | 2011-124246 | 6/2011 |
| JP | 2011-146613 | 7/2011 |
| KR | 10-0455829 | 11/2004 |
| KR | 10-2011-0032845 | 3/2011 |
| KR | 10-1078143 B1 | 10/2011 |
| KR | 10-2013-0053576 A | 5/2013 |

* cited by examiner

SEMICONDUCTOR DEVICE

CROSS-REFERENCE TO RELATED APPLICATION

This application claims the benefit of Korean Patent Application No. 10-2013-0152569 filed on Dec. 9, 2013, with the Korean Intellectual Property Office, the disclosure of which is incorporated herein by reference in its entirety.

BACKGROUND

The present disclosure relates to a semiconductor device.

In line with the development of communications technologies, heterojunction field effect transistors (HFETs) may be used in an environment for transmitting high speed large capacity signals or an environment for home appliances or electric vehicles using high power. In HFETs, electrons having high concentrations may be induced to a heterojunction interface between semiconductor layers having different band gaps, exhibiting high electronic mobility, and thus, HFETs may be advantageously used as high power elements. In general, however, HFETs have normally-ON characteristics, causing a power consumption problem that negative power needs to be applied to turn HFETs off. Thus, research into an HFET having normally-OFF characteristics is requested in the art.

SUMMARY

An aspect of the present disclosure may provide a semiconductor device having normally-OFF characteristics and excellent ON resistance and threshold voltage characteristics.

However, objects of the present disclosure are not limited thereto and objects and effects that may be recognized from technical solutions or embodiments described hereinafter may also be included although not explicitly mentioned.

According to an aspect of the present disclosure, a semiconductor device may include: a first semiconductor layer having a first band gap; a second semiconductor layer including first and second regions separately disposed on an upper surface of the first semiconductor layer and having a second band gap wider than the first band gap; and a third semiconductor layer disposed between the first and second regions of the second semiconductor layer, extending up to at least a portion of the first semiconductor layer, wherein the third semiconductor layer has a channel region doped with an impurity.

The third semiconductor layer may be formed of a semiconductor material different from a material of the first and second semiconductor layers.

A two-dimensional electron gas (2DEG) layer may be positioned in an upper region of the first semiconductor layer adjacent to a junction interface between the first and second semiconductor layers and divided into two regions by the third semiconductor layer, and the channel region may be disposed to be continuous with each of the two regions of the divided 2DEG layer.

The first and second semiconductor layers may be formed of a Group III-V compound semiconductor, and the third semiconductor layer may be formed of a Group IV semiconductor.

The third semiconductor layer may be formed of a silicon semiconductor, and the channel region may be formed of a silicon semiconductor doped with a p-type impurity.

The third semiconductor layer may be formed of a single crystal silicon semiconductor.

The first and second semiconductor layers may have a recess portion extending up to a portion of the first semiconductor layer, by penetrating through the second semiconductor layer, and the third semiconductor layer may be disposed on the recess portion.

The recess portion may penetrate through the first semiconductor layer.

The semiconductor device may further include a semiconductor substrate disposed below the first semiconductor layer, and the third semiconductor layer may be a protrusion protruded from the semiconductor substrate and penetrating through the first semiconductor layer.

The protrusion may extend in a first direction perpendicular to an upper surface of the semiconductor substrate and in a second direction perpendicular to the first direction.

The semiconductor device may further include: a substrate disposed below the first semiconductor layer and a buffer layer disposed between the first semiconductor layer and the substrate.

The semiconductor device may further include: source and drain electrodes disposed on the first and second regions of the second semiconductor layer, respectively; and a gate electrode disposed between the source and drain electrodes, wherein a lower surface of the gate electrode is disposed at a level higher than that of lower surfaces of the source and drain electrodes.

According to another aspect of the present disclosure, a semiconductor device may include: a semiconductor substrate having a protrusion; first and second semiconductor layers stacked on the semiconductor substrate, having different band gaps, and divided into first and second regions by the protrusion, wherein the protrusion includes a channel region doped with an impurity.

A two-dimensional electron gas (2DEG) layer may be positioned in an upper region of the first semiconductor layer adjacent to a junction interface between the first and second semiconductor layers and divided into first and second regions by the protrusion, and the channel region may be disposed to be contiguous with the first and second regions of the divided 2DEG layer.

The protrusion may extend up to at least an upper surface of the second semiconductor layer, by penetrating through the first semiconductor layer.

The semiconductor device may further include a buffer layer disposed between the first semiconductor layer and the semiconductor substrate, wherein the protrusion may extend up to at least an upper surface of the second semiconductor layer, by penetrating through the buffer layer.

According to another aspect of the present disclosure, a semiconductor device may include: a first semiconductor layer; a second semiconductor layer disposed on the first semiconductor layer and divided into first and second regions by a recess portion; a third semiconductor layer disposed on the recess portion, formed of a semiconductor material different from a material of the first and second semiconductor layers, and having a channel region.

A two-dimensional electron gas (2DEG) layer may be positioned in an upper region of the first semiconductor layer adjacent to a junction interface between the first and second semiconductor layers and divided into two regions by the recess portion, and the channel region may be disposed to be continuous with each of the two regions of the divided 2DEG layer.

The third semiconductor layer may be formed of a silicon semiconductor, and the channel region may be formed of a silicon semiconductor doped with a p-type impurity.

The semiconductor device may further include source and drain electrodes disposed on the first and second regions of the second semiconductor layer, respectively; and a gate electrode disposed on the third semiconductor layer.

The semiconductor device may be configured to operate such that a current flow between the source and drain electrodes is cut off when 0V is applied to the gate electrode.

The foregoing technical solutions do not fully enumerate all of the features of the present disclosure. The foregoing and other objects, features, aspects and advantages of the present disclosure will become more apparent from the following detailed description of the present disclosure when taken in conjunction with the accompanying drawings.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
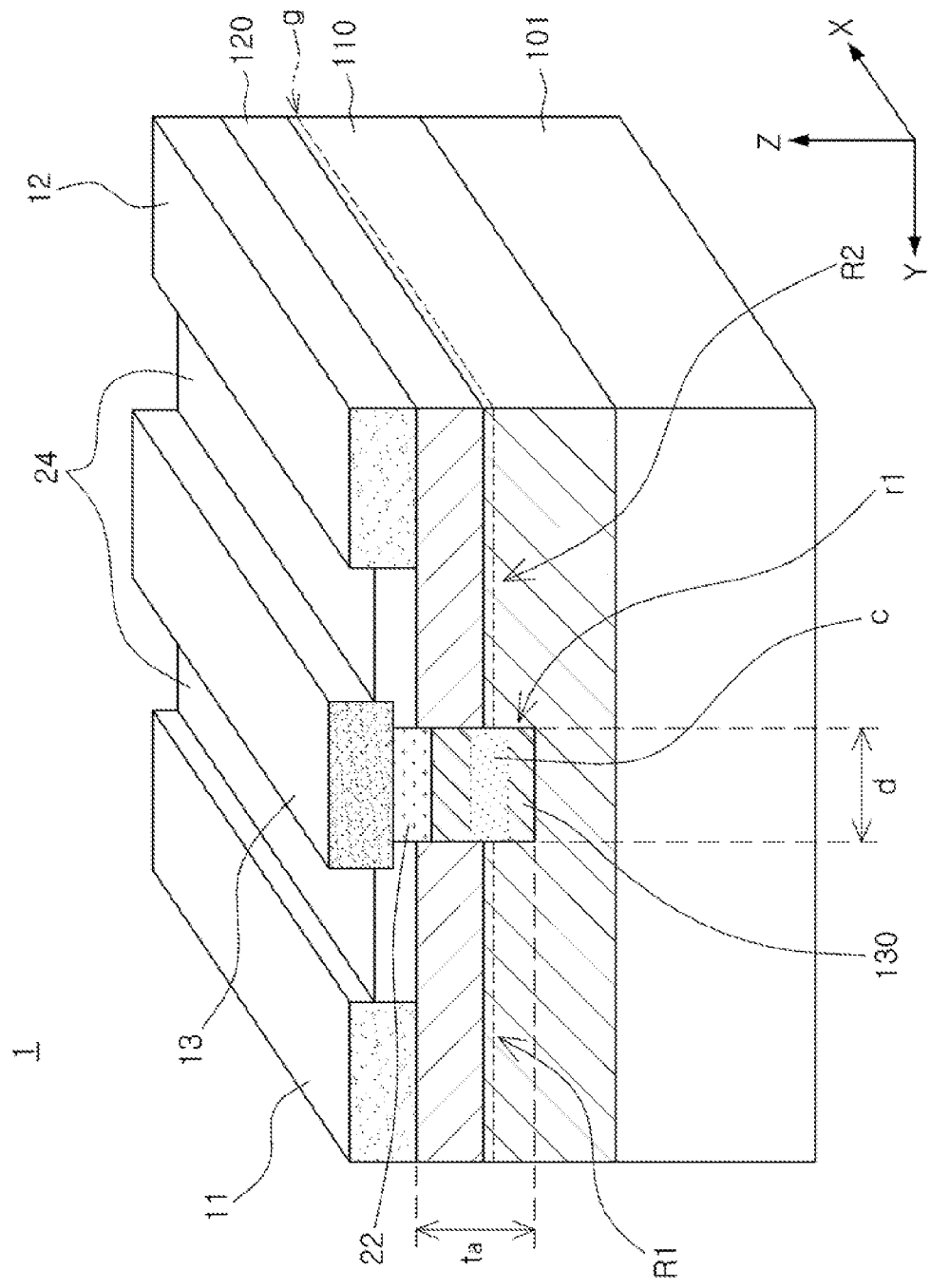
FIG. 1 is a perspective view illustrating a semiconductor device according to an exemplary embodiment of the present disclosure.

Exemplary embodiments of the present disclosure will now be described in detail with reference to the accompanying drawings.

The disclosure may, however, be exemplified in many different forms and should not be construed as being limited to the specific embodiments set forth herein.

In the drawings, the shapes and dimensions of elements may be exaggerated for clarity, and the same reference numerals will be used throughout to designate the same or like elements.

In the present disclosure, terms such as "upper side", "upper portion", "upper surface", "lower side", "lower portion", "lower surface", "lateral surface", and the like, are determined based on the drawings, and in actuality, the terms may be changed according to a direction in which a semiconductor device is disposed.

It will be understood that when an element is referred to as being "connected" or "coupled" to another element, it can be directly connected or coupled to the other element or intervening elements may be present. In contrast, when an element is referred to as being "directly connected" or "directly coupled" to another element, or as "contacting" another element, there are no intervening elements present. Other words used to describe the relationship between elements or layers should be interpreted in a like fashion (e.g., "between" versus "directly between," "adjacent" versus "directly adjacent," "on" versus "directly on").

Also, it will be understood that, although the terms "first", "second", etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

As used herein, the singular forms "a," "an" and "the" are intended to include the plural forms as well, unless the context clearly indicates otherwise. As used herein the term "and/or" includes any and all combinations of one or more of the associated listed items. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of example embodiments.

Devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The terms "substantially" and/or "about" may be used herein to reflect this meaning.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view illustrating a semiconductor device 1 according to an exemplary embodiment of the present disclosure.

As used herein, a semiconductor device may refer to any of the various devices such as shown in FIGS. 1-10, and may also refer, for example, to a device such as a power transistor, a semiconductor chip (e.g., power semiconductor chip, memory chip, and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as for example, the various products described below in connection with FIGS. 11 and 12, or other products.

Referring to FIG. 1, a semiconductor device 1 according to the present exemplary embodiment may include a first semiconductor layer 110 having a first band gap, a second semiconductor layer 120 disposed on the first semiconductor layer 110 and having a second band gap wider than the first band gap, and a third semiconductor layer 130.

The second semiconductor layer 120 may include first and second regions R1 and R2 separately disposed on an upper surface of the first semiconductor layer 110, and the third semiconductor layer 130 may be disposed between the first and second regions R1 and R2.

A substrate 101 may be disposed below the first semiconductor layer 110. The substrate 101 may be provided as a semiconductor growth substrate and may be formed of a conductive or an insulating material. For example, the substrate 101 may be formed of sapphire, silicon (Si), silicon carbide (SiC), gallium nitride (GaN), aluminum nitride (AlN), or zinc oxide (ZnO).

The first and second semiconductor layers 110 and 120 may be formed of, for example, a Group III-V compound semiconductor, and may be formed of any one selected from among GaN, AlGaN, InGaN, and InAlGaN. The second semiconductor layer 120 may have a band gap wider than that of the first semiconductor layer 110 and be stacked on the first semiconductor layer 110. For example, the first semiconductor layer 110 may be formed of GaN, while the second semiconductor layer 120 may be formed of AlGaN.

In this case, due to the heterojunction between the two semiconductor layers having different band gaps, a two-dimensional electronic gas (2DEG) layer g may be generated in an upper portion of the first semiconductor layer 110 adjacent to a junction interface between the first and second semiconductor layers 110 and 120.

According to the present exemplary embodiment, the first and second semiconductor layers 110 and 120 may be undoped semiconductors which are not doped with an impurity on purpose, but the present disclosure is not limited thereto and the first and second semiconductor layers 110 and 120 may be implemented as semiconductors doped with an impurity. For example, the semiconductor layers 110 and 120 may be implemented as semiconductors doped with an n-type impurity.

In the present exemplary embodiment, a source electrode 11 may be disposed in the first region R1, and a drain electrode 12 may be disposed in the second region R2.

The source and drain electrodes 11 and 12 may be in ohmic-contact with the second semiconductor layer 120. The source and drain electrodes 11 and 12 may include, for example, at least one material selected from the group consisting of chromium (Cr), aluminum (Al), tantalum (Ta), titanium (Ti), gold (Au), tungsten (W), TiN, nickel (Ni), and alloys thereof. In one embodiment, the source and drain electrodes 11 and 12 are formed of the same metal, but the present disclosure is not limited thereto. For example, the source and drain electrodes 11 and 12 may have a structure in which two or more metals are stacked, for example, a stacked Ti/Al/Ni/Au structure.

The third semiconductor layer 130 may be disposed between the first and second regions R1 and R2 of the second semiconductor layer 120 to separate the first and second regions R1 and R2 and may extend up to at least a portion of the first semiconductor layer 110. Thus, the 2DEG layer g generated in an upper portion of the first semiconductor layer 110 due to heterojunction between the first and second semiconductor layers 110 and 120 may be divided into two regions with the third semiconductor layer 130 interposed therebetween. Namely, when the semiconductor device 1 is turned on, a current flows through the 2DEG layer g. However, in the present exemplary embodiment, since the third semiconductor layer 130 divides the 2DEG layer g, a semiconductor device available for a normally-OFF operation such that a current flow is cut off when a gate voltage is 0V may be implemented.

In the semiconductor device 1 according to the present exemplary embodiment, the first and second semiconductor layers 110 and 120 may include a recess portion r1 penetrating through the second semiconductor layer 120 to extend up to at least a portion of the first semiconductor layer 110, and the third semiconductor layer 130 may be disposed on the recess portion r1. Here, the recess portion r1 may extend in an x-axis direction to divide the 2DEG layer g into two regions.

In general, in the case in which the recess portion r1 dividing the 2DEG layer g is formed to implement a normally-OFF operation, operating characteristics of the semiconductor device may be determined by a thickness $t_a$ and a width d of the recess portion r1, and thus, the thickness $t_a$ and the width d of the recess portion are required to be precisely controlled. Also, in case of a semiconductor device used in an environment in which a high threshold voltage is required, a thickness $t_a$ and a width d of a recess portion r1 may need to be set to be wide, but a problem in that ON resistance of the device is increased may arise.

In contrast, in the case of the semiconductor device according to the present exemplary embodiment, the 2DEG layer g may be divided by the third semiconductor layer 130 disposed on the recess portion r1, and the third semiconductor layer 130 includes a channel region c including an impurity.

The channel region c may be disposed to be in contact with the two regions of the 2DEG layer g divided by the third semiconductor layer, and when a voltage higher than or equal to a threshold voltage is applied to the gate electrode 13, a channel connecting the divided 2DEG layer g may be formed.

The channel region c may be formed by injecting an impurity into the third semiconductor layer 130, but the present disclosure is not limited thereto. For example, the channel region c may be formed by injecting a p-type dopant into the third semiconductor layer 130. In this case, when a positive (+) voltage higher than or equal to the threshold voltage is applied to the gate electrode 13, the p-type dopant is moved in a direction opposite to a direction in which the gate electrode 13 is disposed due to a field effect, forming a depletion region in the channel region c, and thus, a current flows in the 2DEG layer g by way of the depletion region.

In this case, in the semiconductor device 1 according to an exemplary embodiment of the present disclosure, a threshold voltage may be determined according to a doping amount of an impurity included in the channel region c. In detail, in case of implementing a semiconductor device requiring a high threshold voltage, a doping amount of a p-type dopant included in the channel region c is set to be high, and conversely, in case of implementing a semiconductor device requiring a low threshold voltage, a doping amount of a p-type dopant included in the channel region c may be set to be small. Namely, in the present exemplary embodiment, even without precisely controlling the thickness $t_a$ and width d of the recess portion r1, a threshold voltage may be set to be varied by controlling a doping amount of an impurity included in the channel region c, and a semiconductor device performing a normally-OFF operation not dependent upon a trade-off relationship such that ON resistance is increased as a threshold voltage is increased may be implemented. Meanwhile, the channel region c is illustrated to be spaced apart from a gate insulating layer 22 by a predetermined distance, but the present disclosure is not limited thereto and the channel region c may extend upwardly within the third semiconductor layer 130 so as to be contiguous with a lower surface of the gate insulating layer 22.

The third semiconductor layer 130 may be formed of a material different from that of the first and second semiconductor layers 110 and 120, for example, a Group IV semiconductor, but the present disclosure is not limited thereto. In this case, the third semiconductor layer 130 may be formed of a silicon semiconductor. For example, the third semiconductor layer 130 may be formed of at least one of amorphous silicon, polycrystalline silicon, and single crystal silicon. Single crystalline silicon may have low resistance and high carrier mobility, allowing a current to aptly pass through a channel, and thus, ON resistance characteristics of the semiconductor device may be improved.

In addition, in a case in which a Group III semiconductor (for example, silicon (Si)), rather than a Group III-V semiconductor (for example, GaN), is used as a material of the third semiconductor layer 130, high quality gate insulating layer 22 may be formed on the third semiconductor layer 130 as described hereinafter.

In the present exemplary embodiment, the gate insulating layer 22 may be disposed on the third semiconductor layer 130. The gate insulating layer 22 may be formed of an insulating material, for example, silicon oxide ($SiO_x$), silicon nitride ($SiN_x$), hafnium nitride (HfN), a metal oxide such as $Al_2O_3$, or the like.

In the present exemplary embodiment, the gate insulating layer 22 disposed on the third semiconductor layer 130 may be a thermal oxide film. In general, in case of forming an oxide film on a Group III-V semiconductor, for example, on a GaN-based semiconductor layer, the oxide film is formed at a temperature ranging from approximately 250° C. to 300° C. in consideration of the possibility of damage to the GaN-based semiconductor layer, so it may be difficult to form a high quality insulating layer. In contrast, in the present exemplary embodiment, in the case of using a Group IV semiconductor, for example, silicon (Si) semiconductor, as the third semiconductor layer 130, a high temperature process of approximately 900° C. may be performed, and thus, the gate insulating layer 22 may be formed as a high quality thermal oxidation film having reduced impurity concentration.

A gate electrode 13 may be disposed on the gate insulating layer 22. The gate electrode 13 may be formed, for example, by using at least one material selected from the group consisting of chromium (Cr), aluminum (Al), tantalum (Ta), titanium (Ti), gold (Au), tungsten (W), TiN, nickel (Ni), and alloys thereof.

Also, a passivation layer 24 may be disposed between the source electrode 11 and the gate electrode 13 and between the drain electrode 12 and the gate electrode 13 in order to prevent an undesired electrical short circuit.

According to the present exemplary embodiment, a semiconductor device in which a threshold voltage is precisely set, regardless of a shape of the recess portion r1, by controlling a doping amount of an impurity included in the channel region c may be provided, and normally-OFF characteristics may be obtained by improving ON resistance characteristics.

Figure 2:
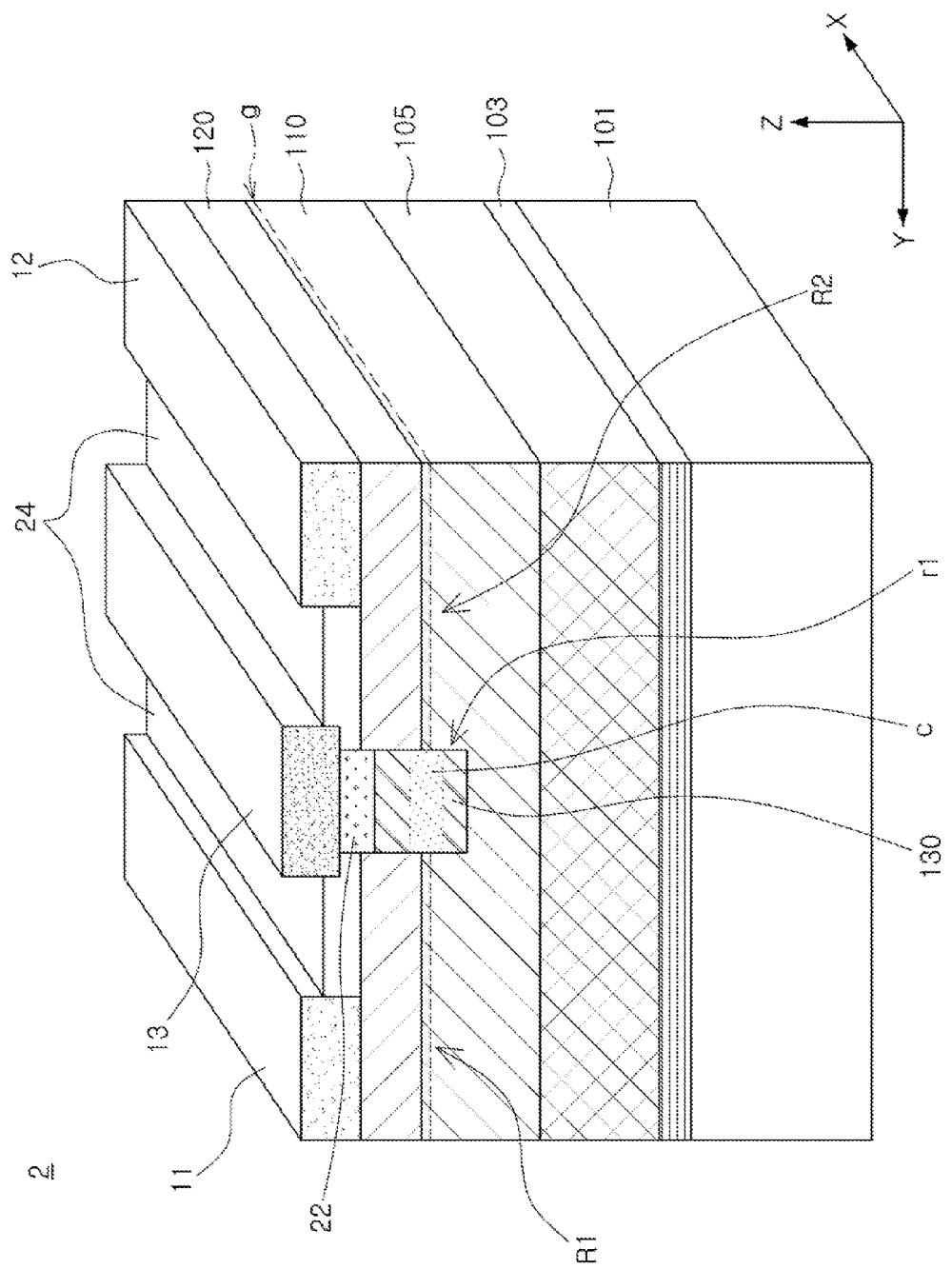
FIG. 2 is a perspective view illustrating a semiconductor device according to a modified embodiment of FIG. 1.

FIG. 2 is a perspective view illustrating a semiconductor device according to a modified embodiment of FIG. 1. Here, matters that may be applied in the same manner as those of the exemplary embodiment of FIG. 1 will be omitted and different components will be described.

Referring to FIG. 2, a semiconductor device 2 according to a modified embodiment may further include a buffer layer 103 disposed between the substrate 101 and the first semiconductor layer 110. The buffer layer 103 may be provided to mitigate a degradation of quality of the semiconductor layer due to a difference in lattice constants and coefficients of thermal expansion between the substrate 101 and the first semiconductor layer 110. The buffer layer 103 may be formed as, for example, an aluminum nitride film (AlN), but the present disclosure is not limited thereto. For example, the buffer layer 103 may be formed of a material such as GaN, ZrB2, HfB$_2$, ZrN, HfN, TiN, or the like, and the buffer layer 130 may be formed as a combination of a plurality of layers.

In addition, the semiconductor device 2 may further include a high resistance semiconductor layer 105 disposed between the buffer layer 103 and the first semiconductor layer 110. The high resistance semiconductor layer 105 may have relatively high resistance to prevent a leakage current. For example, the high resistance semiconductor layer 105 may have resistance higher than the first semiconductor layer 110. For example, the high resistance semiconductor layer 105 may be a semi-insulating GaN layer. Also, the high resistance semiconductor layer 105 may be formed as an AlGaN layer in which a composition of aluminum (Al) is gradually graded, thus performing a function of effectively cutting off a leakage current.

Hereinafter, a method of manufacturing the semiconductor device 2 according to the exemplary embodiment illustrated in FIG. 2 will be described in detail with reference to FIGS. 3A through 3F.

Figure 3A:
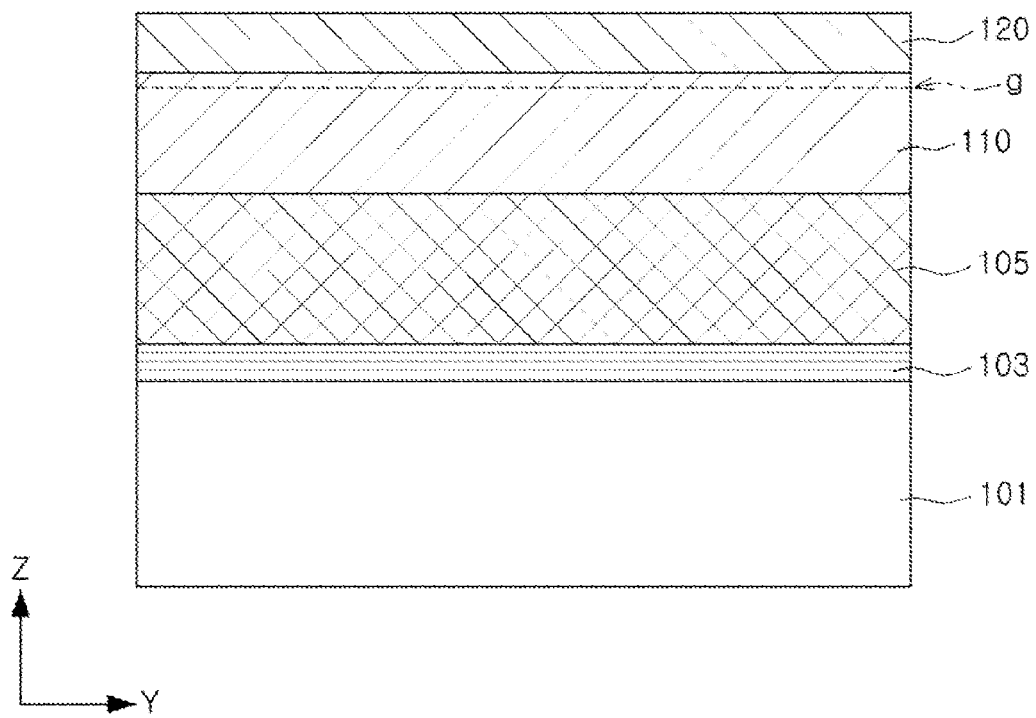
FIGS. 3A through 3F are cross-sectional views illustrating sequential processes of a method of manufacturing the semiconductor device according to a modified embodiment of FIG. 2.

The manufacturing method according to the present exemplary embodiment may start with operation to form a first semiconductor layer 110 having a first band gap and a second semiconductor layer 120 having a second band gap wider than the first band gap, as illustrated in FIG. 3A. In this case, due to heterojunction between the two semiconductor layers having different band gaps, a 2DEG layer g may be formed in an upper portion of the first semiconductor layer 110 adjacent to a junction interface between the first and second semiconductor layers 110 and 120.

In the present exemplary embodiment, after a buffer layer 103 and/or a high resistance semiconductor layer 105 are formed on the substrate 101, the first semiconductor layer 110 may be formed on the buffer layer 103 and/or the high resistance semiconductor layer 105.

This operation may be performed by using a semiconductor layer growth process such as metal organic chemical vapor deposition (MOCVD), hydride vapor phase epitaxy (HVPE), molecular beam epitaxy (MBE), or the like, known in the art.

Figure 3B:
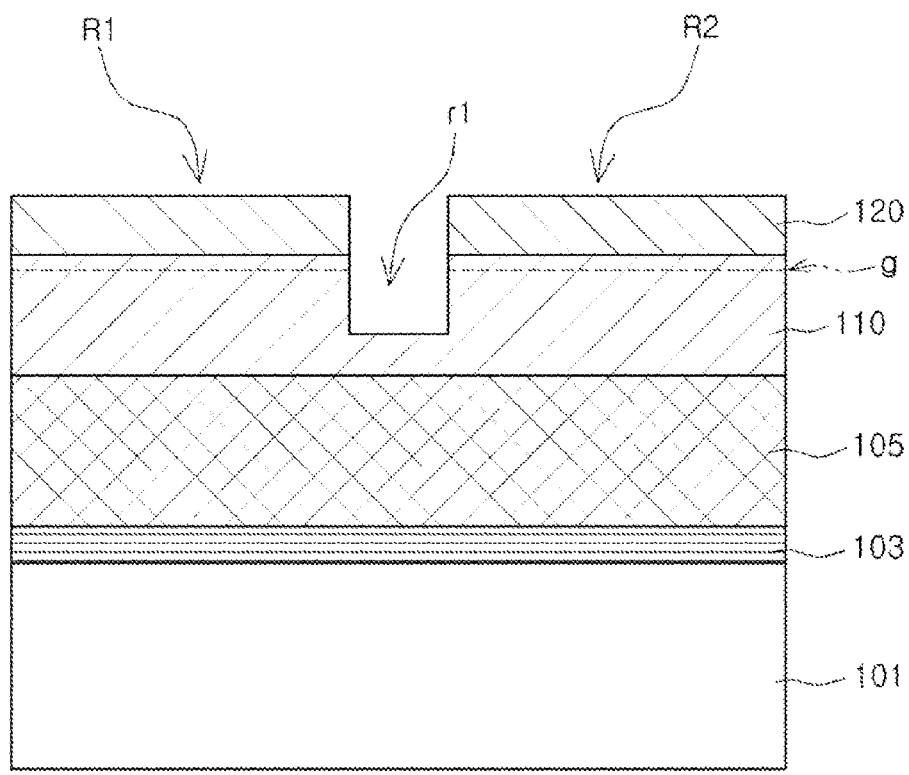

Next, as illustrated in FIG. 3B, a recess portion r1 is formed, penetrating through the second semiconductor layer 120, to extend up to a portion of the first semiconductor layer 110. In this case, portions of the second semiconductor layer 120 and the first semiconductor layer 110 may be divided into first and second regions R1 and R2. Accordingly, the 2DEG layer g formed in an upper portion of the first semiconductor layer 110 may be understood as being divided by the recess portion r1. This operation may be performed by using a semiconductor layer etching process such as dry etching or wet etching, for example.

Thereafter, a third semiconductor layer 130 is formed on the recess portion r1. The third semiconductor layer 130 may be formed to fill at least a portion of the recess portion r1, and the 2DEG layer g may be divided into two regions by the third semiconductor layer 130.

The third semiconductor layer 130 may be formed of a material different from that of the first and second semiconductor layers 110 and 120, for example, a Group IV semiconductor, but the present disclosure is not limited thereto. In this case, the third semiconductor layer 130 may be formed of at least one of amorphous silicon, polycrystalline silicon, and single crystal silicon. Here, since single crystalline silicon has low resistance and high carrier mobility, ON resistance characteristics of the semiconductor device may be improved.

Figure 3C:
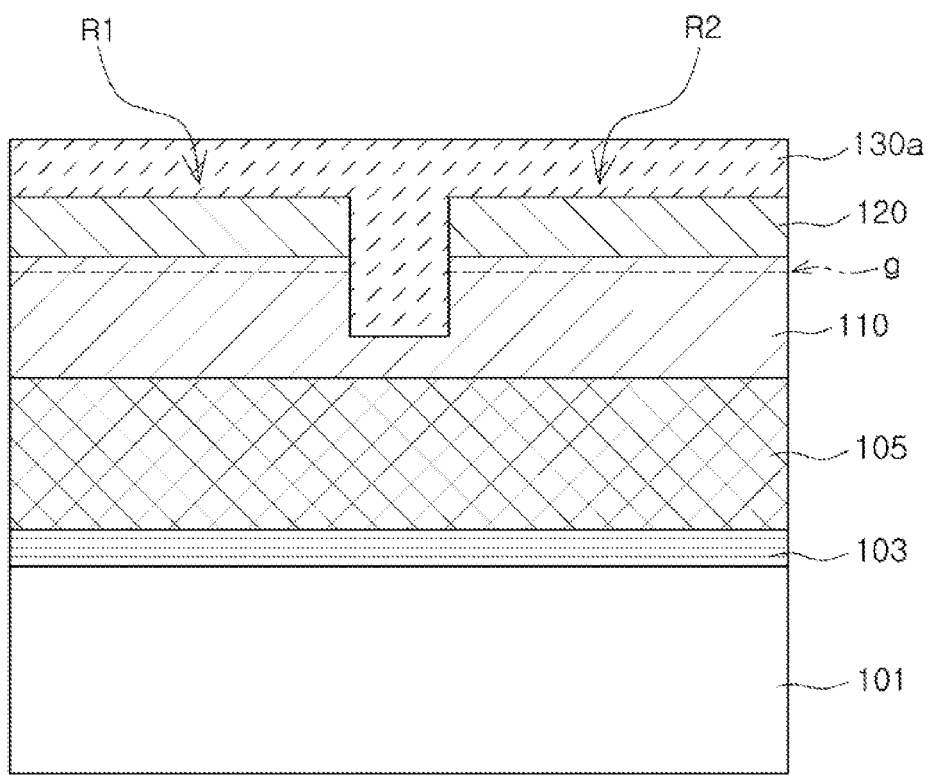

This operation may include operation to deposit a semiconductor layer 130a formed of amorphous silicon or polycrystalline silicon on the second semiconductor layer 120 and the recess portion r1, for example, as illustrated in FIG. 3C.

Figure 3D:
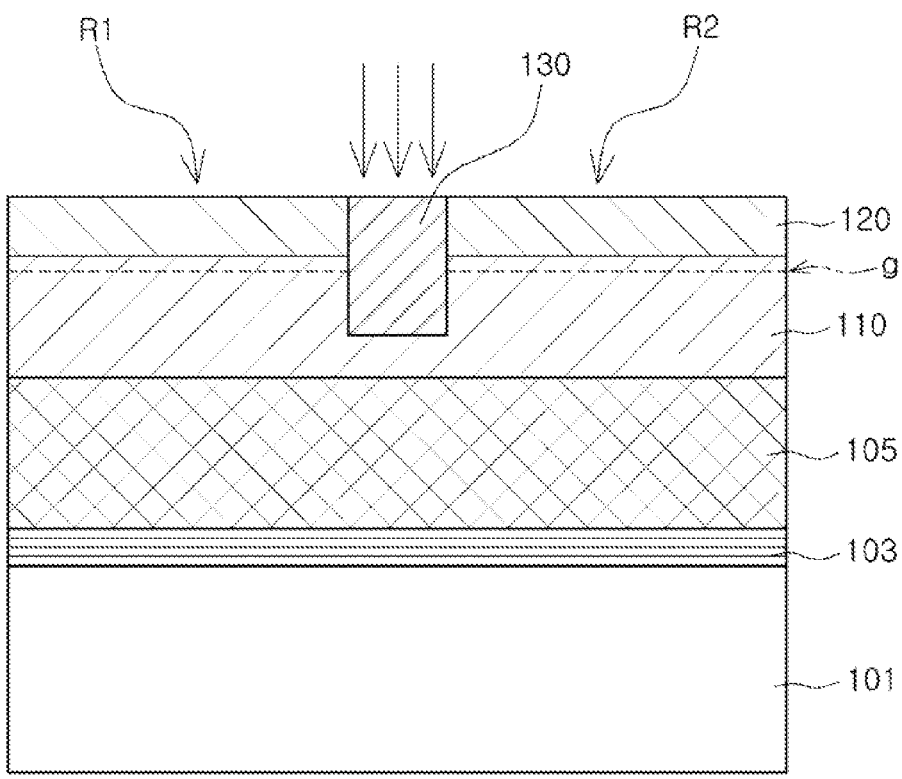

Thereafter, a portion of the deposited semiconductor layer 130a formed of amorphous silicon or polycrystalline silicon formed on the second semiconductor layer 120 is removed by using a process such as polishing, or the like, and laser annealing and/or high temperature annealing is applied to the remaining semiconductor layer 130a formed of amorphous silicon or polycrystalline silicon to recrystallize the semiconductor layer 130a. Accordingly, the third semiconductor layer 130 formed of single crystalline silicon may be formed as illustrated in FIG. 3D.

Figure 3E:
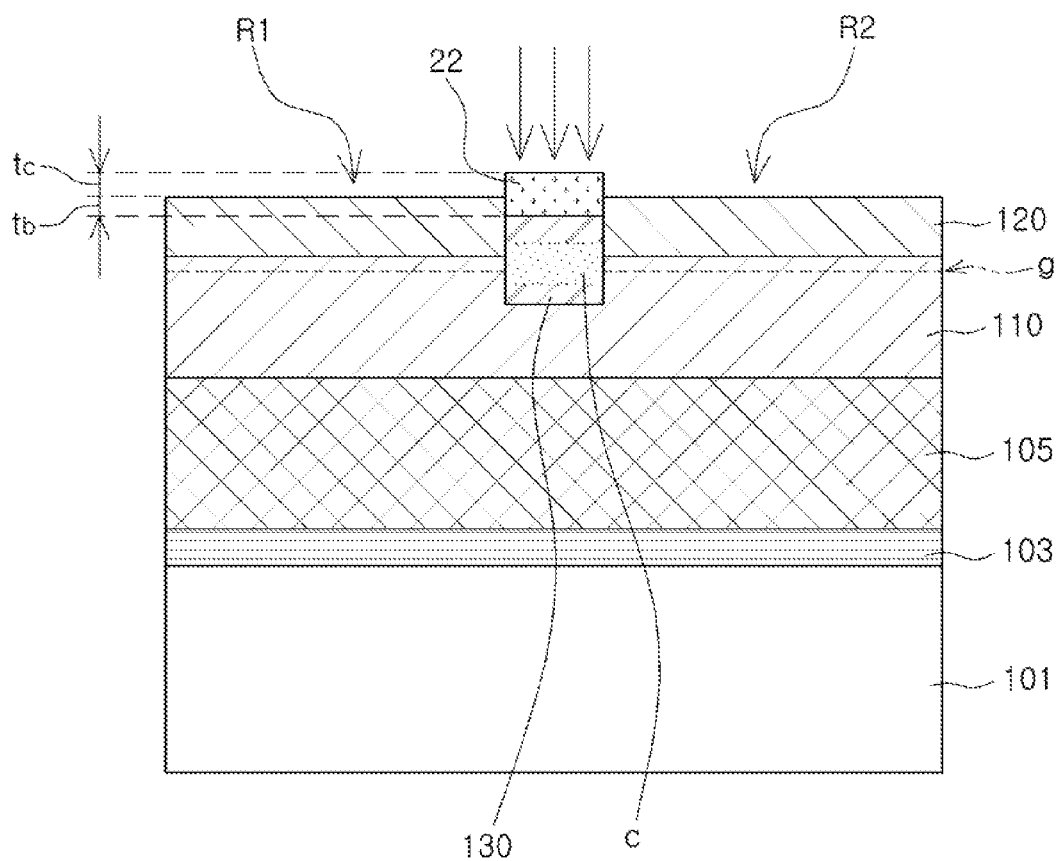

Thereafter, as illustrated in FIG. 3E, a gate insulating layer 22 is formed on the third semiconductor layer 130. The gate insulating layer 22 may be formed of silicon oxide (SiO$_x$), silicon nitride (SiN$_x$), hafnium nitride (HfN), or a metal oxide such as Al$_2$O$_3$, or the like.

In the present exemplary embodiment, the gate insulating layer 22 may be a thermal oxide film formed at a temperature higher than or equal to approximately 900° C. by using furnace equipment, or the like. In particular, in a case in which the third semiconductor layer 130 is formed of a silicon (Si) semiconductor, a high temperature process may be applied in forming a gate oxide film, relative to a case in which an oxide film is formed on a GaN-based semiconductor layer, and thus, a high quality gate insulating layer 22 having a reduced amount of an impurity may be obtained. In this case, the thermal oxide film may be formed of SiO$_2$, but the present disclosure is not limited thereto. In this case, in the case in which a silicon semiconductor is used as a material of the third semiconductor layer 130, a portion of the third semiconductor layer 130 having a thickness $t_b$, starting from an upper surface of the third semiconductor layer 130, may be transformed into a gate insulating layer 22 due to oxidation. Accordingly, upon being added with a thickness $t_c$ of a newly deposited oxide film, the gate insulating layer 22 may have a thickness totaling $t_b+t_c$. In a case in which a gate electrode 13 is disposed on the gate insulating layer 22 during a subsequent process, the gate electrode 13 may be positioned such that a lower surface thereof is located at a level higher than lower surfaces of source and drain electrodes 11 and 12 (refer to $t_c$ in FIG. 3F). However, the present disclosure is not limited thereto and, as will be described hereinafter with reference to FIG. 5, the lower surface of the gate electrode 13 may be located at a level lower than the lower surfaces of the source and drain electrodes 11 and 12.

In certain embodiments, the gate insulating layer 22 may be formed by using a process such as plasma enhanced chemical vapor deposition (PECVD), low pressure chemical vapor deposition (LPCVD), atomic layer deposition (ALD), or the like.

Thereafter, a channel region c including an impurity is formed in the third semiconductor layer 130. This operation may be performed by injecting an impurity into the third semiconductor layer 130 by using an ion implantation process.

The channel region 3 may be formed by injecting an impurity into an upper region of the first semiconductor layer 110 adjacent to a junction interface between the first and second semiconductor layers 110 and 120, specifically, into a position corresponding to a region in which a 2DEG layer g is formed due to heterojunction between the first and second semiconductor layers 110 and 120.

In the present exemplary embodiment, the impurity may be a p-type dopant, and, for example, magnesium (Mg), beryllium (Be), boron (B), or the like, may be used as the p-type dopant, but the present disclosure is not limited thereto. In the present exemplary embodiment, in a case in which the third semiconductor layer 130 is formed of a silicon semiconductor, the channel region c may be a silicon semiconductor doped with a p-type impurity.

Figure 3F:
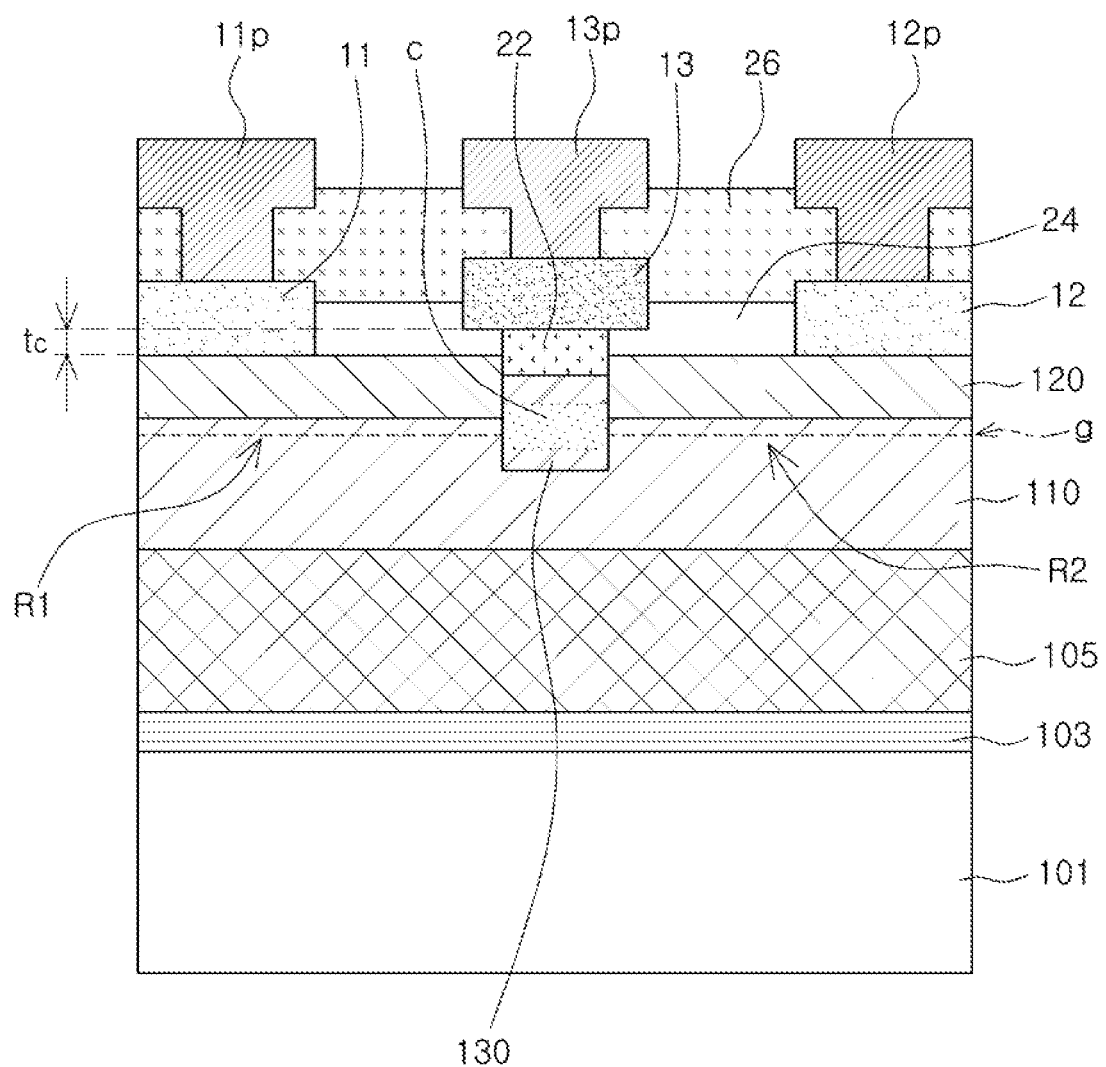

Thereafter, the gate electrode 13 may be disposed on the gate insulating layer 22 and the source and drain electrodes 11 and 12 may be disposed in the first and second regions R1 and R2 of the second semiconductor layer 120, respectively, to obtain a semiconductor device as illustrated in FIG. 3F.

In the present exemplary embodiment, a passivation layer 24 may be formed between the source and gain electrodes 11 and 13 and the drain and gate electrodes 12 and 13 in order to prevent an undesired electrical short circuit.

As illustrated, a source pad 11p, a gate pad 13p, and a drain pad 12p may be provided to be connected to the source electrode 11, the gate electrode 13, and the drain electrode 12, respectively. In order to prevent an undesired electrical short circuit between the pad electrodes, an upper passivation layer 26 may be formed between the pad electrodes. The passivation layer 24 and the upper passivation layer 26 may be formed of an insulating material such as silicon oxide ($SiO_x$), silicon nitride ($SiN_x$), hafnium nitride (HfN), a metal oxide such as $Al_2O_3$, or the like.

Figure 4A:
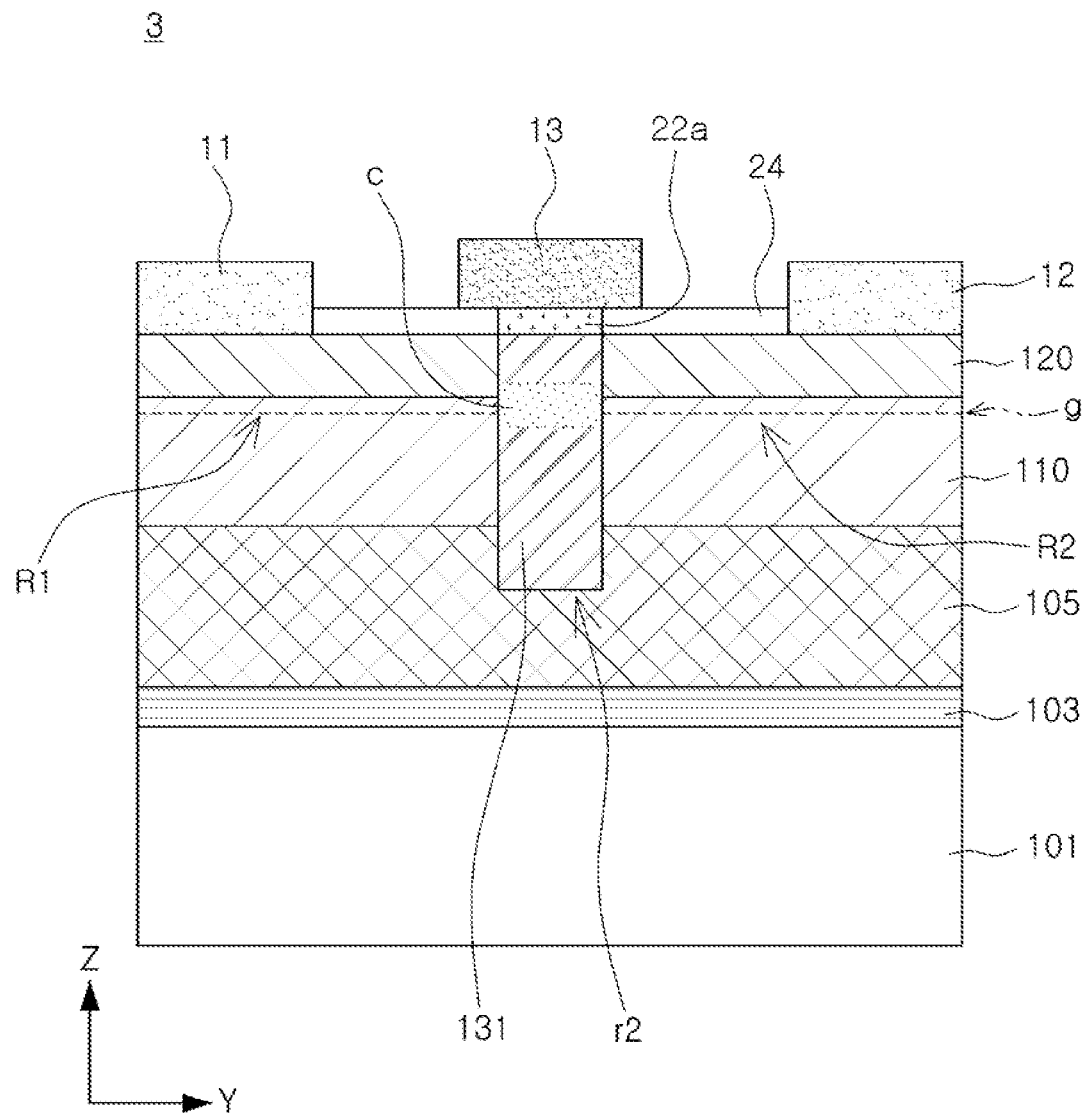
FIGS. 4A and 4B are cross-sectional views illustrating the semiconductor device according to a modified embodiment of FIG. 2.
Figure 4B:
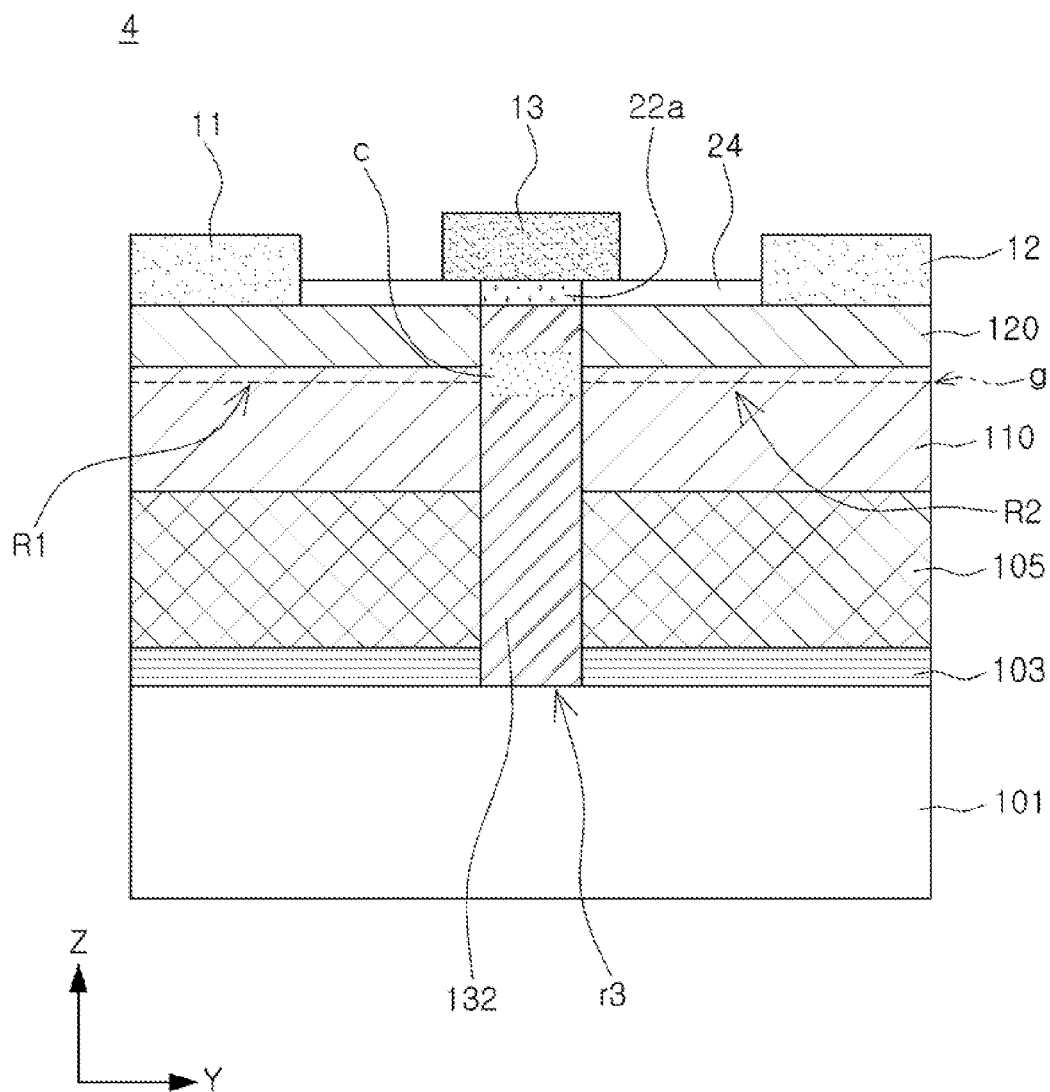

FIGS. 4A and 4B are cross-sectional views illustrating the semiconductor device according to a modified embodiment of FIG. 2. Here, matters that may be applied in the same manner as those of the exemplary embodiment of FIG. 2 will be omitted and different components will be described.

Referring to FIG. 4A, a semiconductor device 3 according to a modified embodiment may include a third semiconductor layer 131 disposed between first and second divided regions R1 and R2 of a second semiconductor layer 120 and penetrating through a first semiconductor layer 110.

In the present exemplary embodiment, a recess portion r2 is formed to penetrate through both the second semiconductor layer 120 and the first semiconductor layer 110, and the third semiconductor layer 131 may be disposed in the recess portion r2 to fill the recess portion r2.

A 2DEG layer g divided by the third semiconductor layer 131 may be contiguous with a channel region c included in the third semiconductor layer 131, and a threshold voltage and ON resistance characteristics of the semiconductor device 3 may be appropriately set depending on a doping amount of an impurity included in the channel region c.

In the present exemplary embodiment, the third semiconductor layer 131 is illustrated as extending up to a portion of a high resistance semiconductor layer 105, by penetrating through the first and second semiconductor layers 110 and 120, but the present disclosure is not limited thereto. In detail, like a semiconductor device 4 illustrated in FIG. 4B, the third semiconductor layer 131 may penetrate through the high resistance semiconductor layer 105 and a buffer layer 103 to extend up to a substrate 101.

Namely, in the exemplary embodiment of FIG. 4B, a recess portion r3 may be formed to extend up to the substrate 101, by penetrating through all of the plurality of layers (for example, the first and second semiconductor layers 110 and 120, the high resistance semiconductor layer 105, and the buffer layer 103), and a third semiconductor layer 132 may fill the recess portion r3.

Also, as illustrated in FIGS. 4A and 4B, a gate insulating layer 22a may be disposed on the third semiconductor layer 131 or 132. Unlike the gate insulating layer 22 described above, the gate insulating layer 22a may not include a region (refer to $t_b$ in FIG. 3E) that has been transformed into the gate electrode layer 22a as a portion of the third semiconductor layer 131 or 132 was oxidized. In this case, the gate insulating layer 22a may be disposed such that a lower surface thereof is positioned at the same level as that of an upper surface of the second semiconductor layer 120 (e.g., the surfaces contact each other).

Figure 5:
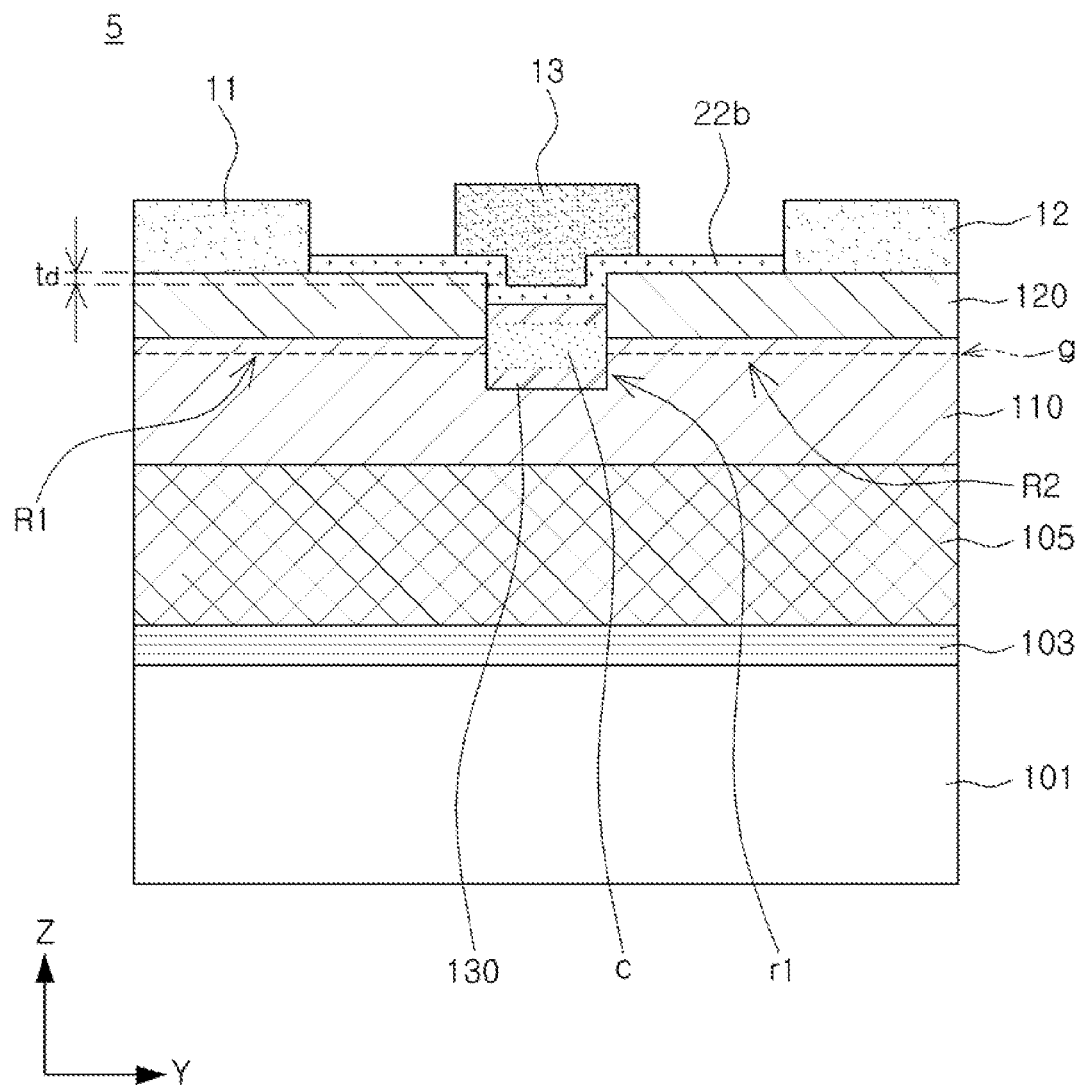
FIG. 5 is a cross-sectional view illustrating the semiconductor device according to a modified embodiment of FIG. 2.

FIG. 5 is a cross-sectional view illustrating a semiconductor device according to a modified embodiment of FIG. 2. Here, matters that may be applied in the same manner as those of the exemplary embodiment of FIG. 2 will be omitted and different components will be described.

Referring to FIG. 5, a semiconductor device 5 according to the modified embodiment includes a third semiconductor layer 130 disposed between first and second divided regions R1 and R2 of a second semiconductor layer 120 and extending up to at least a portion of a first semiconductor layer 110.

In the present exemplary embodiment, the third semiconductor layer 130 is disposed on a recess portion r1 extending up to a portion of the first semiconductor layer 110, by penetrating through the second semiconductor layer 120. Here, unlike in the exemplary embodiment of FIG. 2, the third semiconductor layer 130 may be disposed to fill only a portion of the recess portion r1, rather than completely filling up the recess portion r1.

In order to divide a 2DEG layer g formed in an upper portion of the first semiconductor layer 110 adjacent to a junction interface between the first and second semiconductor layers 110 and 120, the third semiconductor layer 130 may be disposed to fill the recess portion r1 to a height of the junction interface between the first and second semiconductor layers 110 and 120. In the present exemplary embodiment, an upper surface of the third semiconductor layer 130 may have a level lower than that of the second semiconductor layer 120.

A gate insulating layer 22b may be formed on the third semiconductor layer 130. In the present exemplary embodiment, the gate insulating layer 22b may be disposed on the third semiconductor layer 130 and extends to the sides of the source and drain electrodes 11 and 12 to prevent an undesired electrical short circuit between the source electrode 11, the gate electrode 13, and the drain electrode 12.

In the present exemplary embodiment, since the third semiconductor layer 130 is disposed to fill only a portion of the recess portion r1, the gate insulating layer 22b may have a concave portion formed above a region in which the third semiconductor layer 130 is disposed. In this case, a lower surface of the gate electrode 13 formed on the gate insulating layer 22b may be positioned at a level lower by a predetermined thickness $t_d$ than a lower surface of at least one of the source and drain electrodes 11 and 12.

Figure 6:
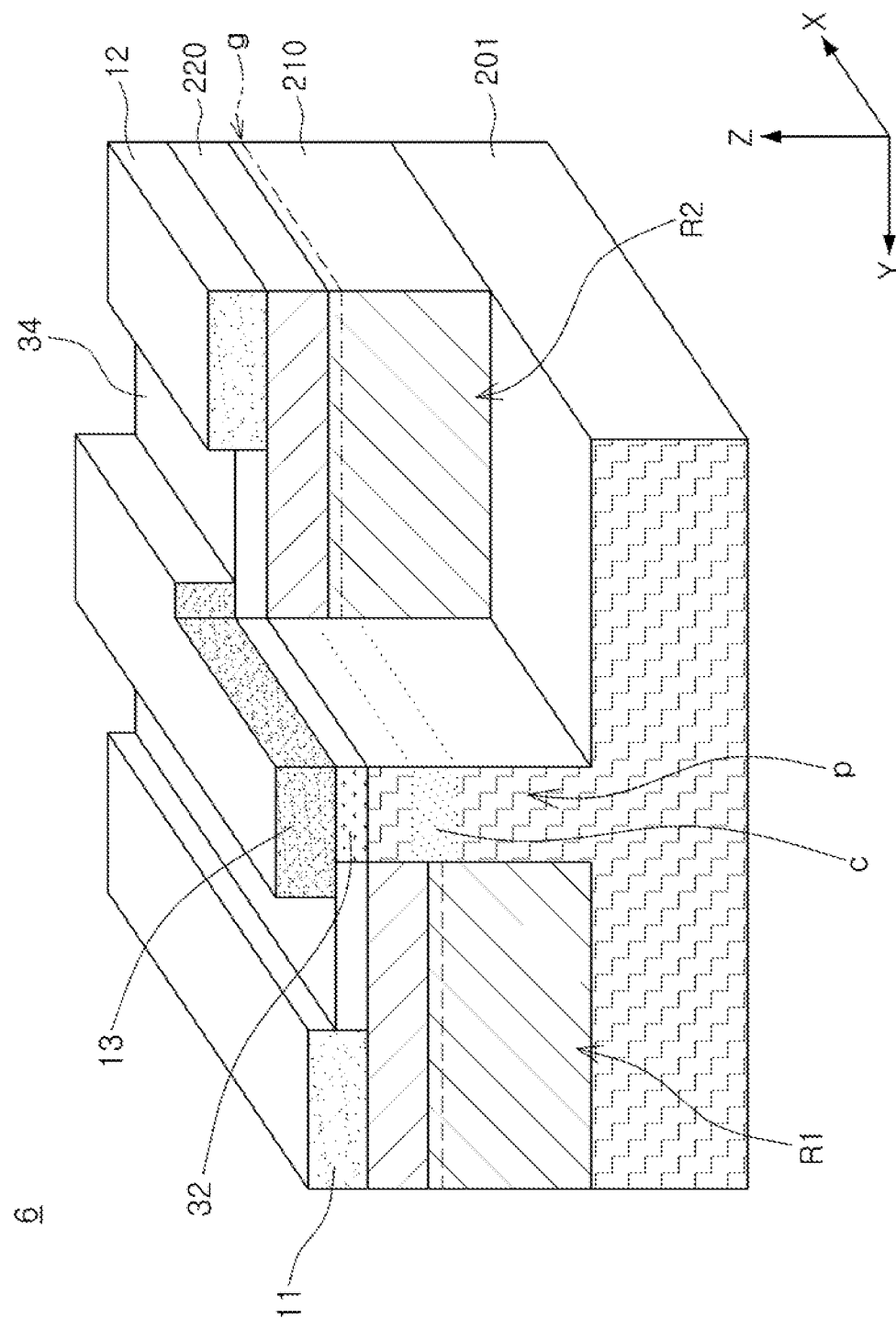
FIG. 6 is a perspective view illustrating a partially cutaway semiconductor device according to an exemplary embodiment of the present disclosure.

FIG. 6 is a perspective view illustrating a partially cutaway semiconductor device 6 according to an exemplary embodiment of the present disclosure.

Referring to FIG. 6, the semiconductor device 6 according to the present exemplary embodiment includes a semiconductor substrate 201 and first and second semiconductor layers 210 and 220 stacked on the semiconductor substrate 201 to have different band gaps. In the present exemplary embodiment, the semiconductor substrate 201 has a protrusion p, and the first and second semiconductor layers 210 and 220 may be divided into first and second regions R1 and R2 by the protrusion p.

Source and drain electrodes 11 and 12 are disposed on the second semiconductor layer 220 disposed in the first and second regions R1 and R2, respectively. A gate insulating layer 32 may be disposed on the protrusion p, and a gate electrode 13 may be disposed on the gate insulating layer 32.

In FIG. 6, in order to help understand a configuration of the protrusion p, portions of the first and second semiconductor layers 210 and 220, the drain electrode 12, a passivation layer 34, and the gate electrode 13 disposed on the right of the protrusion p are omitted.

The first and second semiconductor layers 210 and 220 may have different band gaps. For example, the first semiconductor layer 210 may have a first band gap, and the second semiconductor layer 220 may have a second band gap wider than the band gap (first band gap) of the first semiconductor layer 210. Thus, a 2DEG layer g may be formed in an upper portion of the first semiconductor layer 210 adjacent to a junction interface between the first and second semiconductor layers 210 and 220.

The protrusion p divides the respective first and second semiconductor layers 210 and 220 into first and second regions R1 and R2. Thus, the 2DEG layer g is divided with the protrusion p interposed therebetween, and the semiconductor device 6 may perform normally-OFF operation to cut off a current flow when a gate voltage is 0V.

The protrusion p is illustrated to penetrate through the first semiconductor layer 210 to extend up to an upper surface of the second semiconductor layer 220, but the present disclosure is not limited thereto. Thus, as described hereinafter with reference to FIG. 9, the protrusion p may penetrate through the first semiconductor layer 210 but an upper surface thereof may be positioned at a level lower than an upper surface of the second semiconductor layer 220.

The protrusion p may include a channel region c including an impurity. In the present exemplary embodiment, the channel region c may be disposed to be contiguous with two regions of the 2DEG layer g divided by the protrusion p, and when a voltage higher than or equal to a threshold voltage is applied to the gate electrode 13, the channel region c may form a channel connecting the divided regions of the 2DEG layer. The channel region c may be formed by injecting an impurity into the protrusion p, but the present disclosure is not limited thereto. For example, the channel region c may be formed by injecting a p-type dopant into the protrusion p.

Namely, the present exemplary embodiment may be understood as having a configuration in which the semiconductor substrate 201 is disposed below the first semiconductor layer 210 and a third semiconductor layer protrudes from the semiconductor substrate 201 to be provided as the protrusion p penetrating through the first semiconductor layer 210.

The channel region c is illustrated as being disposed to be spaced apart from the gate insulating layer 32 by a predetermined distance, but the present disclosure is not limited thereto and the channel region c may be formed to be contiguous with a lower surface of the gate insulating layer 32.

In the present exemplary embodiment, a material of the semiconductor substrate 201 is not particularly limited as long as it is a semiconductor material allowing for impurity doping in the protrusion p. The semiconductor substrate 201 may be formed of a material identical to that of the first and second semiconductor layers 210 and 220 or a different material. For example, the semiconductor substrate 201 may be formed of silicon (Si), silicon carbide (SiC), or gallium nitride (GaN). In the case in which the semiconductor substrate 201 is formed of silicon, the silicon may be single crystal silicon facilitating growth of a semiconductor layer (for example, the first and second semiconductor layers 210 and 220) on the semiconductor substrate 201. However, the present disclosure is not limited thereto and the semiconductor substrate 201 may be formed of amorphous silicon or polycrystalline silicon, for example.

In the present exemplary embodiment, the gate insulating layer 32 is disposed on the protrusion p. The gate insulating layer 32 may be formed of an insulating material, for example, silicon oxide ($SiO_x$), silicon nitride ($SiN_x$), hafnium nitride (HfN), a metal oxide such as $Al_2O_3$, or the like. In the present exemplary embodiment, when the semiconductor substrate 201 is formed of a silicon (Si), the gate insulating layer 32 may be formed as a high quality thermal oxide film having a reduced impurity concentration.

The gate electrode 13 may be disposed on the gate insulating layer 32. The gate electrode 13 may be formed, for example, of at least any one material selected from the group consisting of chromium (Cr), aluminum (Al), tantalum (Ta), titanium (Ti), gold (Au), tungsten (W), TiN, nickel (Ni), and alloys thereof.

The source and drain electrodes 11 and 12 may be disposed on the first and second regions R1 and R2 into which the second semiconductor layer 220 is divided, respectively. The source and drain electrodes 11 and 12 may include, for example, at least one material selected from the group consisting of chromium (Cr), aluminum (Al), tantalum (Ta), titanium (Ti), gold (Au), tungsten (W), TiN, nickel (Ni), and an alloy thereof. Here, the source and drain electrodes 11 and 12 may be formed of the same metal, but the present disclosure is not limited thereto. For example, the source and drain electrodes 11 and 12 may have a structure in which two or more metals are stacked, for example, a stacked Ti/Al/Ni/Au structure.

In order to prevent an undesired electrical short circuit, a passivation layer 34 may be disposed between the source and gate electrodes 11 and 13 and between the drain and gate electrodes 12 and 13.

According to the present exemplary embodiment, in implementing the semiconductor device 6 capable of performing a normally-OFF operation, there is no need to form a recess portion, eliminating the necessity of precisely controlling a thickness or width of a recess portion, and a threshold voltage may be easily set by controlling a doping amount of impurity of the channel region c. In addition, because the first and second semiconductor layers 210 and 220 are grown on the semiconductor substrate 201 divided into the first and second regions R1 and R2 by the protrusion p, strain, or the like, may be reduced, obtaining excellent crystal quality.

Figure 7:
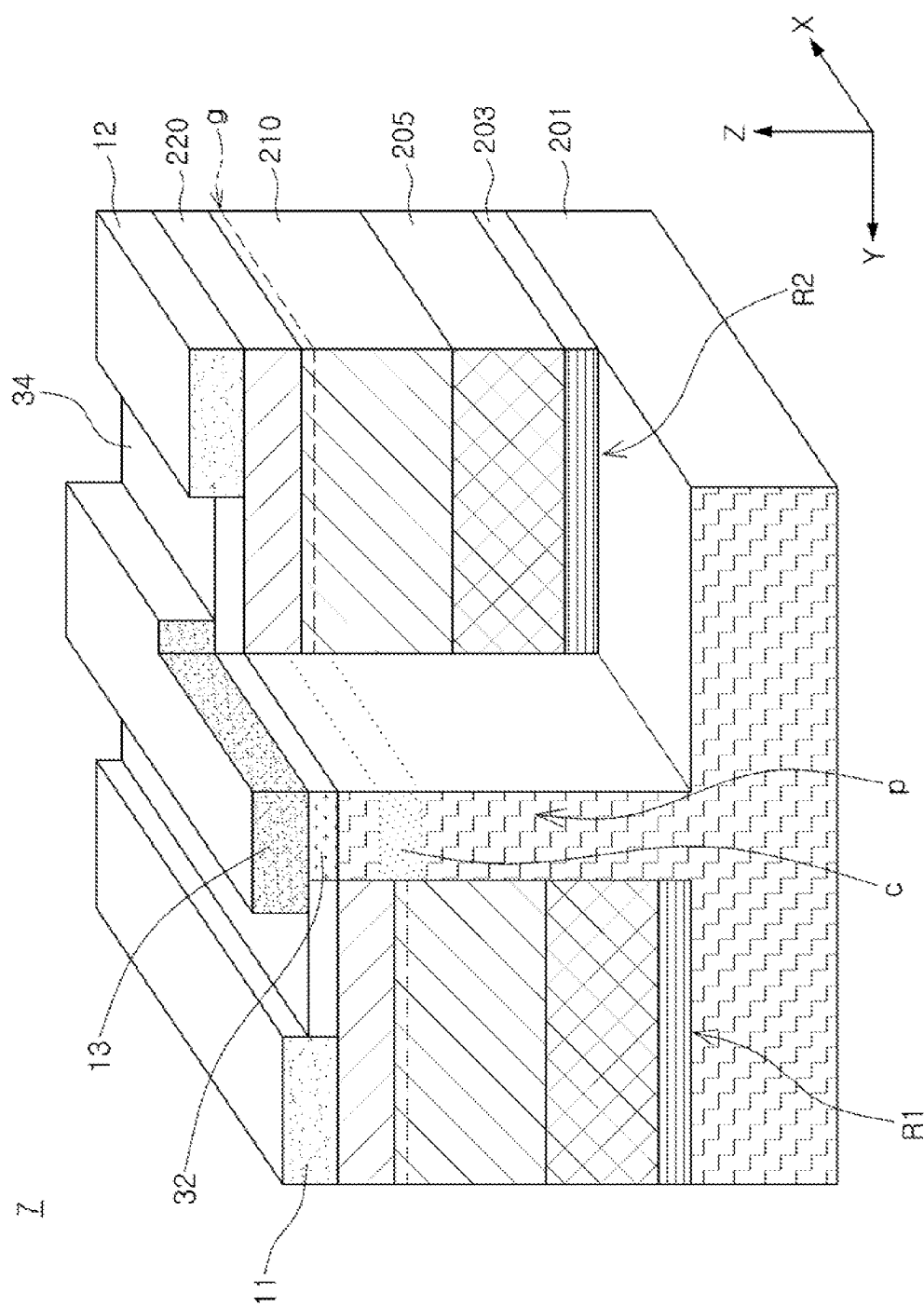
FIG. 7 is a perspective view illustrating a partially cutaway semiconductor device according to a modified embodiment of FIG. 6.

FIG. 7 is a perspective view illustrating a partially cutaway semiconductor device according to a modified embodiment of FIG. 6. Here, matters that may be applied in the same manner as those of the exemplary embodiment of FIG. 6 will be omitted and different components will be described.

Referring to FIG. 7, a semiconductor device 7 according to the modified embodiment may further include a buffer layer 203 disposed between a semiconductor substrate 201 and a first semiconductor layer 210. Also, the semiconductor device 7 may further include a high resistance semiconductor layer 205 disposed between the buffer layer 203 and the first semiconductor layer 210. In this case, the buffer layer 203 and the high resistance semiconductor layer may be divided into first and second regions R1 and R2 by a protrusion p.

In FIG. 7, in order to help understand a configuration of the protrusion p, portions of the buffer layer 203, the high resistance semiconductor layer 205, the first and second semiconductor layers 210 and 220, a drain electrode 12, a passivation layer 34, and a gate electrode 13 disposed on the right of the protrusion p are omitted.

The buffer layer 203 may be provided to mitigate a degradation of quality of the semiconductor layer due to differences in lattice constants and coefficients of thermal expansion between the substrate 201 and the first semiconductor layer 210. The buffer layer 203 may be formed as, for example, an aluminum nitride film (AlN), but the present disclosure is not limited thereto. For example, the buffer layer 203 may be formed of a material such as GaN, ZrB2, HfB$_2$, ZrN, HfN, TiN, or the like, and the buffer layer 130 may be formed as a combination of a plurality of layers.

The high resistance semiconductor layer 205 may have relatively high resistance to prevent a leakage current. The high resistance semiconductor layer 205 may be a semi-insulating GaN layer. Also, the high resistance semiconductor layer 205 may be formed as an AlGaN layer in which a composition of aluminum (Al) is gradually graded.

Hereinafter, a method of manufacturing the semiconductor device 7 according to the exemplary embodiment of FIG. 7 will be described in detail with reference to FIGS. 8A through 8E.

Figure 8A:
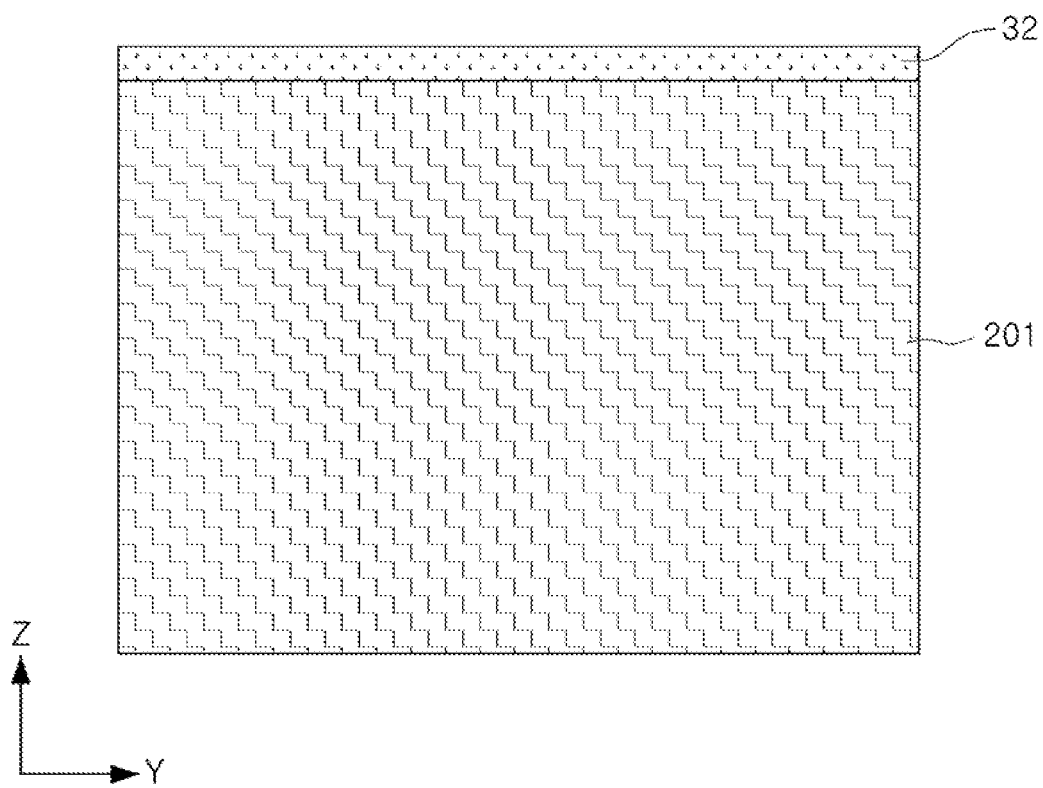
FIGS. 8A through 8E are cross-sectional views illustrating sequential processes of a method of manufacturing the semiconductor device according to the embodiment of FIG. 7.

The manufacturing method according to an exemplary embodiment of the present disclosure may start with operation to prepare the semiconductor substrate 201 as illustrated in FIG. 8A. In the present exemplary embodiment, the gate insulating layer 323 may be formed in advance on the semiconductor substrate 201.

In a case in which a silicon (Si) semiconductor is used as a material of the semiconductor substrate 201, a high temperature process may be applied in forming a gate oxide film, compared to case in which an oxide film is formed on a GaN-based semiconductor layer, and thus, high quality gate insulating layer 32 with a reduced amount of impurity may be obtained. Here, the gate insulating layer 32 may be a thermal oxide film formed at a temperature higher than or equal to approximately 900° C. by using furnace equipment, or the like.

However, the present disclosure is not limited thereto and the gate insulating layer 32 may be formed by using a process such as plasma enhanced chemical vapor deposition (PECVD), low pressure chemical vapor deposition (LPCVD), atomic layer deposition (ALD), or the like.

Figure 8B:
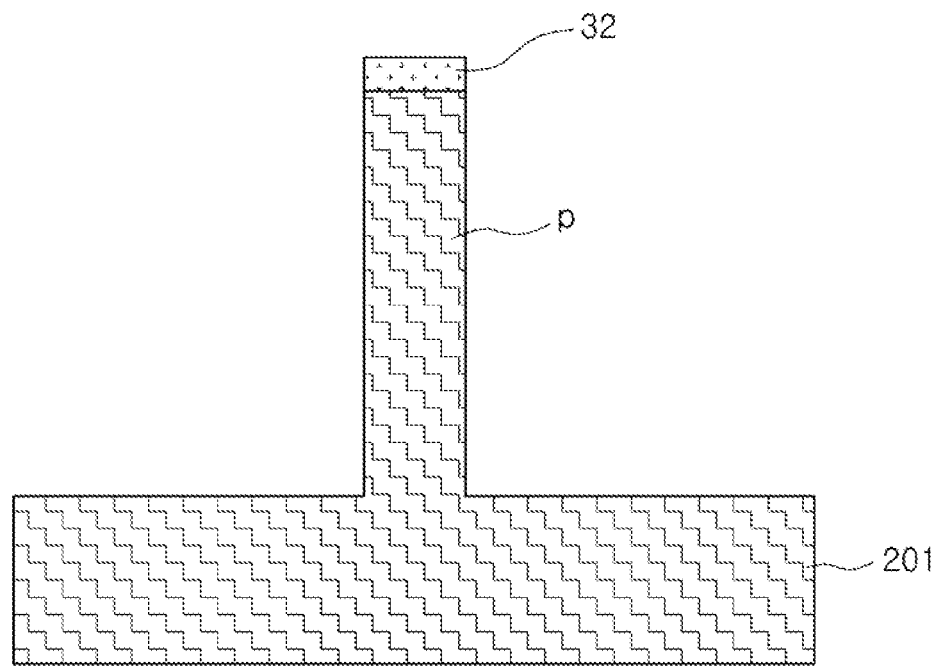

Next, as illustrated in FIG. 8B, the protrusion p is formed on the semiconductor substrate 201. The protrusion p may be formed by removing regions of the semiconductor substrate 201 other than a region in which the protrusion p is to be formed. In this operation, for example, an etching process, or the like, may be used.

Figure 8C:
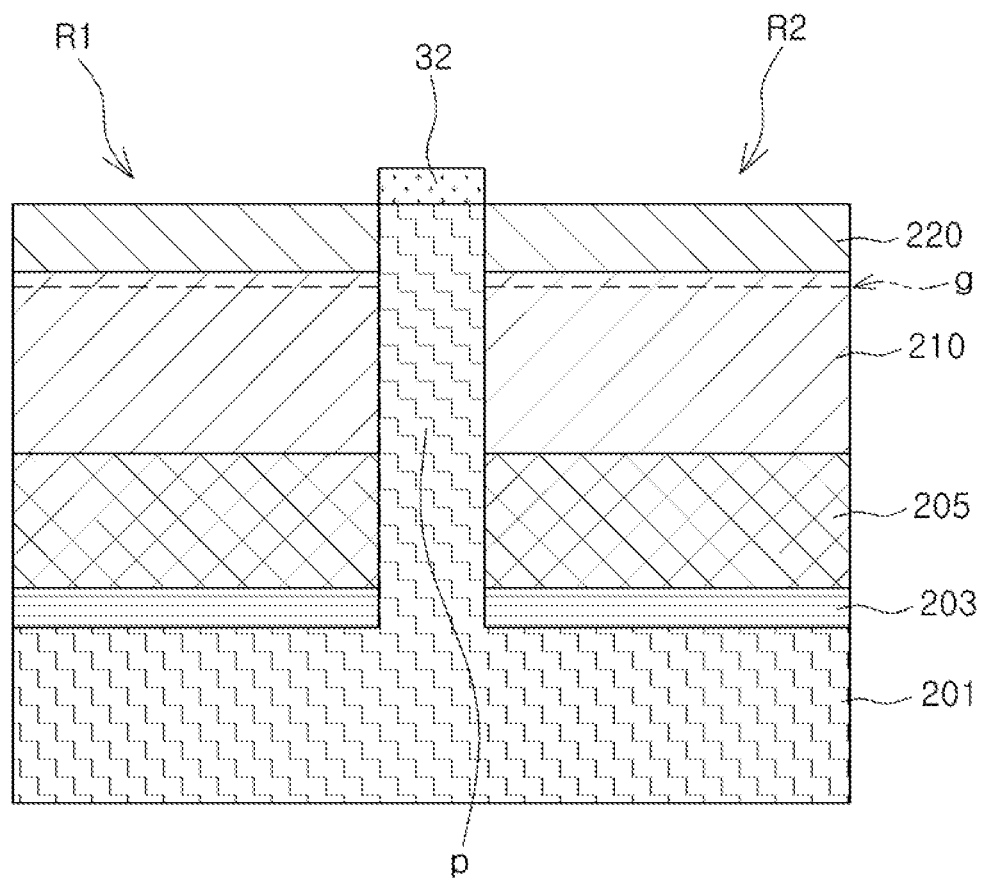

Thereafter, as illustrated in FIG. 8C, the first and second semiconductor layers 210 and 220 having different band gaps are formed on the semiconductor substrate 201. Each of the first and second semiconductor layers 210 and 220 may be divided into the first and second regions R1 and R2 by the protrusion p.

In operation S300, due to heterojunction between the two semiconductor layers having different band gaps, a 2DEG layer g may be formed in an upper portion of the first semiconductor layer 210 adjacent to a junction interface between the first and second semiconductor layers 210 and 220.

In the present exemplary embodiment, after the buffer layer 203 and/or a high resistance semiconductor layer 105 are formed on the substrate 201, the first semiconductor layer 210 may be formed on the buffer layer 203 and/or the high resistance semiconductor layer 205.

This operation may be performed by using a semiconductor layer growth process such as metal organic chemical vapor deposition (MOCVD), hydride vapor phase epitaxy (HVPE), molecular beam epitaxy (MBE), or the like, known in the art.

Figure 8D:
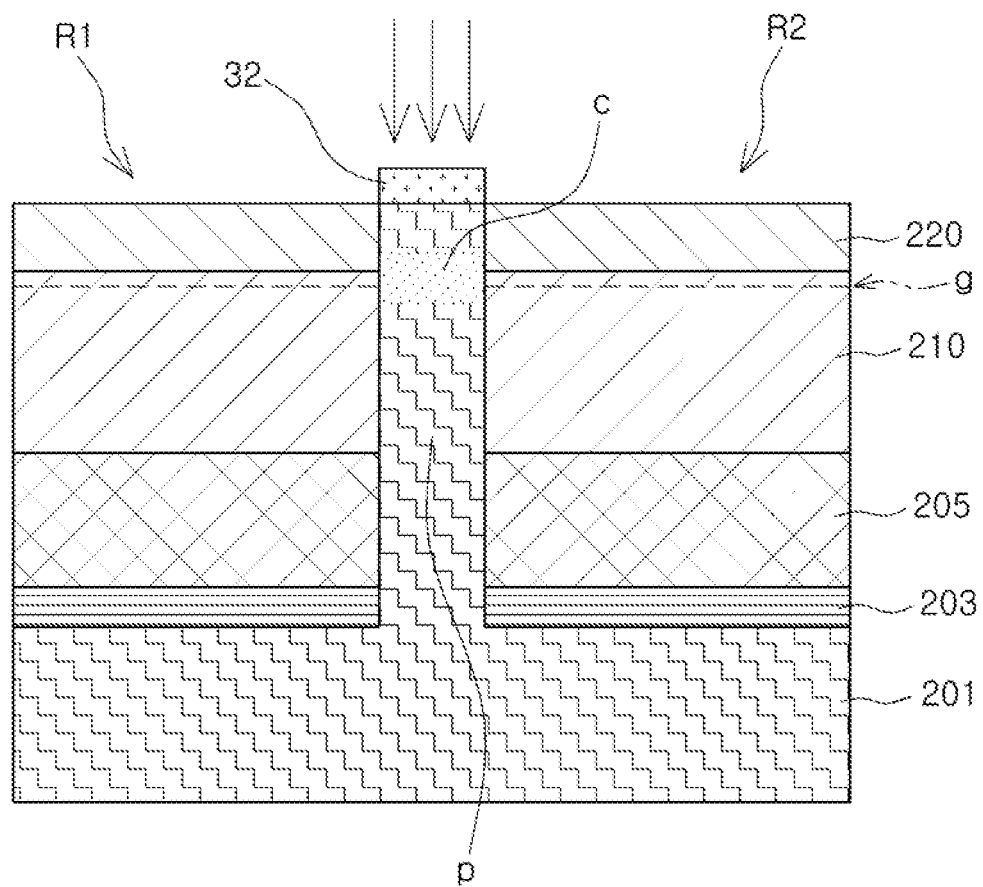

Thereafter, as illustrated in FIG. 8D, the channel region c including an impurity is formed in the protrusion p. This operation may be performed by injecting an impurity into the protrusion p by using an ion implantation process.

The channel region 3 may be formed by injecting an impurity into an upper region of the first semiconductor layer 210 adjacent to a junction interface between the first and second semiconductor layers 210 and 220, specifically, into a position of the protrusion p corresponding to a region in which a 2DEG layer g is formed due to heterojunction between the first and second semiconductor layers 210 and 220.

In the present exemplary embodiment, the impurity may be a p-type dopant, and, for example, magnesium (Mg), beryllium (Be), boron (B), or the like, may be used as the p-type dopant.

Figure 8E:
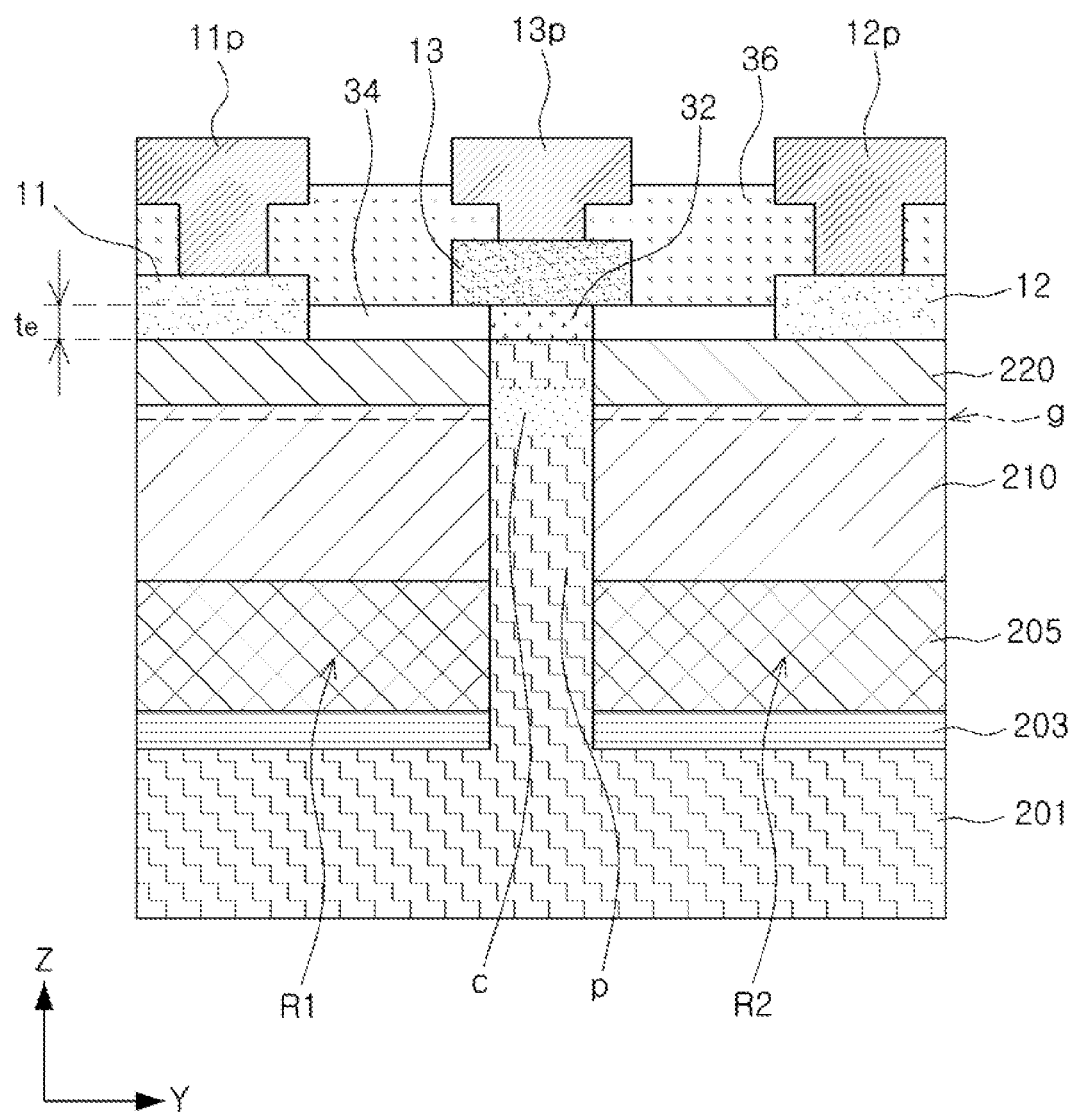

Thereafter, the gate electrode 13 may be disposed on the gate insulating layer 32 and the source and drain electrodes 11 and 12 may be disposed on the second semiconductor layer 220 divided into the first and second regions R1 and R2, respectively, to obtain a semiconductor device as illustrated in FIG. 8E.

In the present exemplary embodiment, the passivation layer 34 may be formed between the source and gate electrodes 11 and 13 and between the drain and gate electrodes 12 and 13 in order to prevent an undesired electrical short circuit.

Also, in the present exemplary embodiment, a source pad 11p, a gate pad 13p, and a drain pad 12p may be further formed to be connected to the source electrode 11, the gate electrode 13, and the drain electrode 12, respectively. In order to prevent an undesired electrical short circuit between the pad electrodes, an upper passivation layer 36 may be further formed between the pad electrodes. The passivation layer 34 and the upper passivation layer 36 may be formed of an insulating material such as silicon oxide (SiO$_x$), silicon nitride (SiN$_x$), hafnium nitride (HfN), a metal oxide such as Al$_2$O$_3$, or the like. The passivation layer 34 and the upper passivation layer 36 may be formed of different materials, but the present disclosure is not limited thereto and the passivation layer 34 and the upper passivation layer 36 may be formed of the same material.

According to the present exemplary embodiment, the gate electrode 13 may be positioned at a level higher than that of the source and drain electrodes 11 and 12. For example, as illustrated in FIG. 8E, the gate electrode 13 may be positioned such that a lower surface thereof is located at a level higher than lower surfaces of source and drain electrodes 11 and 12 by a thickness t$_e$. However, the present disclosure is not limited thereto and, as described hereinafter with reference to FIG. 9, the lower surface of the gate electrode 13 may be located at a level lower than the lower surfaces of the source and drain electrodes 11 and 12.

Figure 9:
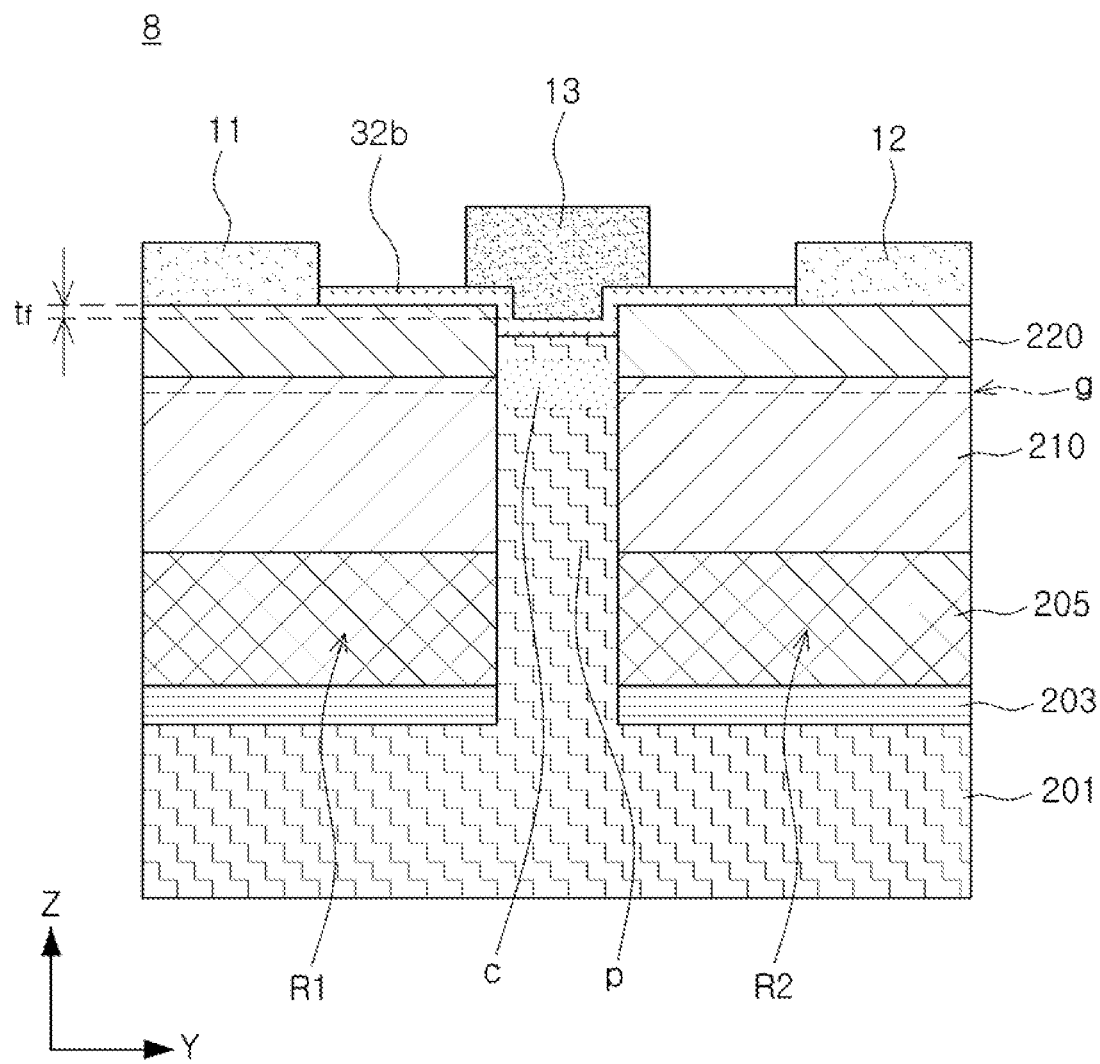
FIG. 9 is a cross-sectional view illustrating a semiconductor device according to a modified embodiment of FIG. 7.

FIG. 9 is a cross-sectional view illustrating a semiconductor device according to a modified embodiment of FIG. 7. Here, matters that may be applied in the same manner as those of the exemplary embodiment of FIG. 7 will be omitted and different components will be described.

Referring to FIG. 9, a semiconductor element 8 according to the modified embodiment has a protrusion p, and first and second semiconductor layers 210 and 220 are divided into first and second regions R1 and R2 by the protrusion p, respectively. Here, unlike the exemplary embodiment of FIG. 7, an upper surface of the protrusion p is positioned at a level lower than that of the upper surface of the second semiconductor layer 220. In this case, the protrusion p extends up to at least an upper surface of the first semiconductor layer 210 in order to divide the 2DEG layer g formed in an upper portion of the first semiconductor layer 210 adjacent to a junction interface between the first and second semiconductor layers 210 and 220.

Also, a gate insulating layer 32b may be formed on the protrusion p. The gate insulating layer 32b may also serve to prevent an undesired electrical short circuit among the source electrode 11, the gate electrode, and the drain electrode 12.

In the present exemplary embodiment, since the protrusion p is positioned at a level lower than that of the upper surface of the second semiconductor layer 220, the gate insulating layer 32b may have a concave portion formed above a region in which the protrusion t is disposed. In this case, a lower surface of the gate electrode 13 formed on the gate insulating layer 32b may be positioned at a level lower by a predetermined thickness $t_f$ than a lower surface of at least one of the source and drain electrodes 11 and 12.

Figure 10:
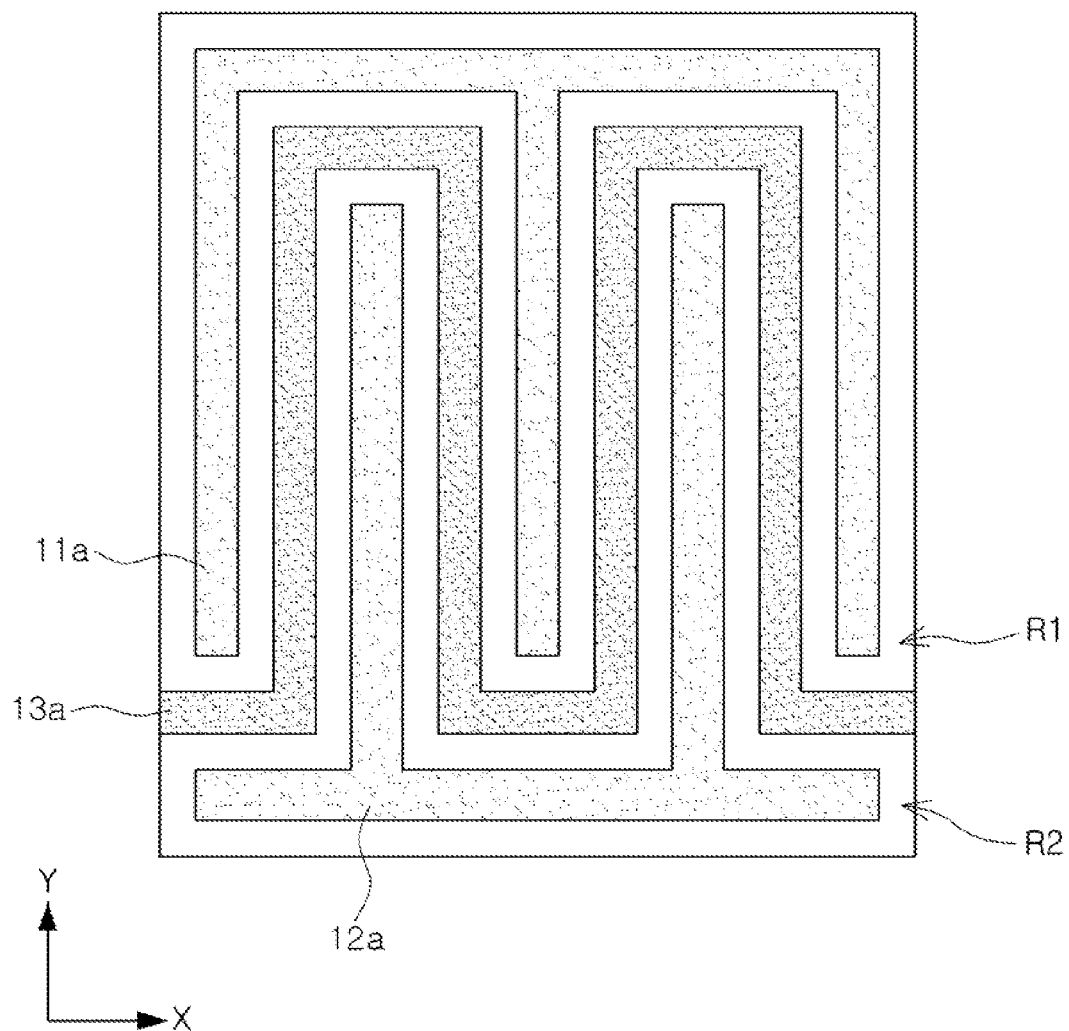
FIG. 10 is a top view illustrating a semiconductor device according to an exemplary embodiment of the present disclosure.

FIG. 10 is a top view illustrating a semiconductor device 9 according to an exemplary embodiment of the present disclosure.

The exemplary embodiment of FIG. 10 may be understood as a top view illustrating an electrode structure applicable to the exemplary embodiment of FIG. 6 as described above, for example.

Referring to FIG. 10, a source electrode 11a, a gate electrode 13a, and a drain electrode 12a of the semiconductor device 9 according to the present exemplary embodiment may include a portion extending in a horizontal direction and a portion extending in a vertical direction, respectively.

In detail, referring to the exemplary embodiment of FIG. 6, based on the upper surface of the semiconductor substrate 201 of the semiconductor device, the protrusion p includes a portion extending in a first direction (for example, vertical direction) perpendicular to the upper surface of the semiconductor substrate 201 and a portion extending in a second direction (for example, horizontal direction) perpendicular to the first direction, and the gate insulating layer 32 and the gate electrode 13a are stacked on the protrusion p.

In this case, since the channel region c connecting the first and second divided regions R1 and R2 of the 2DEG layer g is formed to have a relatively long length, ON resistance characteristics of the device may be improved Hereinafter, an apparatus using the semiconductor devices (1 to 9) according to an exemplary embodiment of the present disclosure will be illustratively described with reference to FIG. 11 to FIG. 12. These semiconductor devices may be included in an electronic device, such as described previously.

Figure 11:
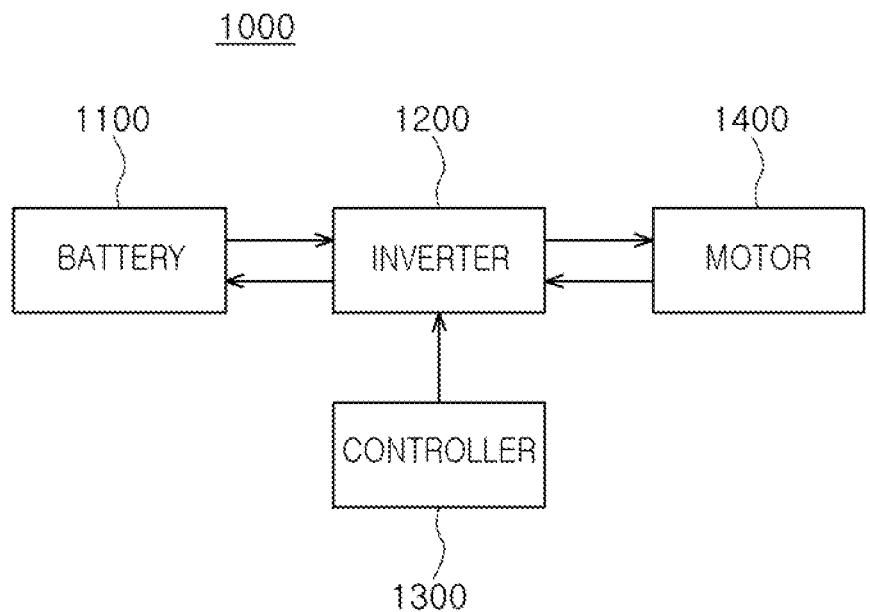
FIGS. 11 and 12 are views illustrating devices using a semiconductor device according to an exemplary embodiment of the present disclosure.

Also, as illustrated in FIG. 11, the semiconductor devices (1 to 9) according to an exemplary embodiment of the present disclosure may be provided in an electric vehicle 1000.

Referring to FIG. 11, the electric vehicle 1000 includes a battery 1100 and a motor 1400. In general, high power is required to drive a vehicle, and a means for boosting an output from the battery 1100 is required. Thus, the electric vehicle 1000 may have an inverter 1200. The inverter 1200 may convert power applied from the battery 1100 into 3-phase alternating current (AC) power to drive the motor 1400.

In the present exemplary embodiment, the motor 1400 may also serve to operate as an electric generator, and thus, power generated by the motor 1400 may be converted into direct current (DC) power by the inverter 1200 and charged in the battery 1100.

In the present exemplary embodiment, the inverter 1200 may include a driving circuit including a switching element and a diode. Here, the switching element may be a power semiconductor device applicable to high power and high temperature environment, which may be the semiconductor device according to the exemplary embodiments as described above. Also, the electric vehicle 1000 may further include a controller 1300 as a means for controlling the driving circuit provided in the inverter 1200. The controller 1300 may serve to provide a signal for controlling an ON/OFF operation, or the like, of the switching element provided in the driving circuit, but the present disclosure is not limited thereto.

Figure 12:
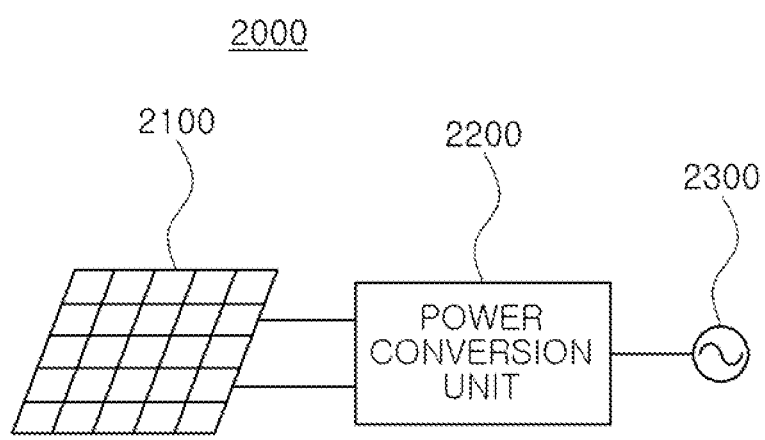

The semiconductor devices (1 to 9) according to another exemplary embodiment of the present disclosure may be provided in a photovoltaic system 2000 as illustrated in FIG. 12.

Referring to FIG. 12, the photovoltaic system 2000 according to the present exemplary embodiment includes a photovoltaic array 2100 converting solar light into an electrical signal and outputting a photovoltaic (PV) signal and a power conversion unit 2200 converting the PV signal and outputting the same to a system 2300. The photovoltaic array 2100 may include at least one solar cell.

In general, an output voltage/current output through the system 2300 may be commercial power for household/industrial purposes supplied to houses, plants, or the like.

The PV signal generated by the photovoltaic array 2100 is converted into an output voltage/current delivered to the system 2300 through the power conversion unit 2200. Thus, the power conversion unit 2200 may include at least one converter circuit and a control circuit controlling an operation of the converter circuit. In the present exemplary embodiment, the control circuit may output a pulse width modulation (PWM) signal to control an operation of the power conversion unit 2200. In order to effectively control an operation of the power conversion unit 2200, the control circuit may sense a PV signal and a system voltage provided as an input and an output, respectively, to the power conversion unit 2200. The converter circuit and the control circuit may include a switching element. Here, the switching element may be a power semiconductor device applicable to a high power environment, and the semiconductor device according to the exemplary embodiments as described above may be employed as the power semiconductor device applicable to a high power environment.

As set forth above, according to exemplary embodiments of the present disclosure, a semiconductor device having normally-OFF characteristics and excellent ON resistance and threshold voltage characteristics may be obtained.

Advantages and effects of the present disclosure are not limited to the foregoing content and any other technical effects not mentioned herein may be easily understood by a person skilled in the art from the foregoing description.

While exemplary embodiments have been shown and described above, it will be apparent to those skilled in the art that modifications and variations could be made without departing from the spirit and scope of the present disclosure as defined by the appended claims.

What is claimed is:

1. A semiconductor memory device comprising:
a first semiconductor layer having a first band gap;
a second semiconductor layer including first and second regions disposed on an upper surface of the first semiconductor layer and having a second band gap wider than the first band gap; and a third semiconductor layer disposed between the first and second regions of the second semiconductor layer, extending into at least a portion of the first semiconductor layer, wherein the third semiconductor layer has a channel region doped with an impurity, and wherein the first and second semiconductor layers are formed of a Group III-V compound semiconductor, and the third semiconductor layer is formed of a Group IV semiconductor.

2. The semiconductor device of claim 1, wherein a two-dimensional electron gas (2DEG) layer is positioned in an upper region of the first semiconductor layer adjacent to a junction interface between the first and second semiconductor layers and divided into two regions by the third semiconductor layer, and the channel region is disposed to be between the two regions of the divided 2DEG layer, and extends vertically above and vertically below the 2DEG layer.

3. The semiconductor device of claim 1, wherein a two-dimensional electron gas (2DEG) layer is positioned in an upper region of the first semiconductor layer adjacent to a junction interface between the first and second semiconductor layers and divided into two regions by the third semiconductor layer, and the channel region is disposed to be continuous with each of the two regions of the divided 2DEG layer.

4. The semiconductor device of claim 1, wherein the third semiconductor layer is formed of a silicon semiconductor, and the channel region is formed of a silicon semiconductor doped with a p-type impurity.

5. The semiconductor device of claim 4, wherein the third semiconductor layer is formed of a single crystal silicon semiconductor.

6. The semiconductor device of claim 1, wherein the first and second semiconductor layers have a recess portion extending up to a portion of the first semiconductor layer, by penetrating through the second semiconductor layer, and the third semiconductor layer is disposed on the recess portion.

7. The semiconductor device of claim 6, wherein the recess portion penetrates through the first semiconductor layer.

8. The semiconductor device of claim 1, further comprising a semiconductor substrate disposed below the first semiconductor layer, wherein the third semiconductor layer is a protrusion protruding from the semiconductor substrate and penetrating through the first semiconductor layer.

9. The semiconductor device of claim 8, wherein the protrusion extends in a first direction perpendicular to an upper surface of the semiconductor substrate and in a second direction perpendicular to the first direction.

10. The semiconductor device of claim 1, further comprising:

a substrate disposed below the first semiconductor layer; and a buffer layer disposed between the first semiconductor layer and the substrate.

11. The semiconductor device of claim 1, further comprising:

source and drain electrodes disposed on the first and second regions of the second semiconductor layer, respectively; and a gate electrode disposed between the source and drain electrodes, wherein a lower surface of the gate electrode is disposed at a level higher than that of lower surfaces of the source and drain electrodes.

12. A semiconductor device comprising:

a high resistance semiconductor layer;

a first semiconductor layer formed on the high resistance semiconductor layer;

a second semiconductor layer disposed on the first semiconductor layer, wherein the second semiconductor layer is divided into first and second regions by a recess portion extending into at least a portion of the high resistance semiconductor layer by penetrating through the first semiconductor layer, and wherein the first semiconductor layer and second semiconductor layer meet at a junction interface;

a third semiconductor layer disposed in the recess portion, formed of a semiconductor material different from a material of the first semiconductor layer and different from a material of the second semiconductor layer, and a channel region formed in the third semiconductor layer at a vertical level between the junction interface at the first region and the junction interface at the second region, wherein the channel region extends vertically above and vertically below the junction interface, and is formed of impurities doped into the semiconductor material of the third semiconductor layer.

13. The semiconductor device of claim 12, wherein a two-dimensional electron gas (2DEG) layer is positioned in an upper region of the first semiconductor layer adjacent to the junction interface between the first and second semiconductor layers and divided into two regions by the recess portion, and the channel region is disposed to be continuous with each of the two regions of the divided 2DEG layer.

14. The semiconductor device of claim 12, wherein the third semiconductor layer is formed of a silicon semiconductor, and the channel region is formed of the silicon semiconductor doped with a p-type impurity.

15. The semiconductor device of claim 12, further comprising source and drain electrodes disposed on the first and second regions of the second semiconductor layer, respectively; and a gate electrode disposed on the third semiconductor layer, wherein the semiconductor device is configured to operate such that a current flow between the source and drain electrodes is cut off when 0V is applied to the gate electrode.

* * * * *